United States Patent [19]

Deering et al.

[11] Patent Number: 4,763,288

[45] Date of Patent: Aug. 9, 1988

[54] SYSTEM FOR SIMULATING ELECTRONIC DIGITAL CIRCUITS

[75] Inventors: Michael F. Deering; Neil Hunt, both of Mountain View, Calif.

[73] Assignee: Schlumberger Systems & Services, Inc., Palo Alto, Calif.

[21] Appl. No.: 815,471

[22] Filed: Dec. 31, 1985

[51] Int. Cl.$^4$ .......................... G06G 7/48; G06F 11/00
[52] U.S. Cl. ...................................... 364/578; 371/20; 371/23
[58] Field of Search .................. 364/578–580, 364/518, 149–151; 340/706, 732; 371/20, 23

[56] References Cited

U.S. PATENT DOCUMENTS

| | | | |
|---|---|---|---|
| 4,590,581 | 5/1986 | Widdoes, Jr. | 364/578 |
| 4,604,718 | 8/1986 | Norman et al. | 364/578 |
| 4,613,945 | 9/1986 | Parker | 364/518 |
| 4,665,501 | 5/1987 | Saldin et al. | 364/518 |

Primary Examiner—Parshotam S. Lall
Assistant Examiner—Brian M. Mattson
Attorney, Agent, or Firm—Theodore S. Park; Robert C. Colwell; Robert Barr

[57] ABSTRACT

A simulation system for visual signal processing circuits is presented which provides a detailed, pixel level analysis of the timing while actually performing the simulation at the frame level. Input to the circuit is the form of images captured by a video camera. The processing of a frame of image data by each circuit component is simulated and the resulting frames of image data are stored until they are no longer needed by other components. The output of the simulated circuit is displayed on a monitor.

The timing of the circuit is analyzed for distinct groups of components which must operate in synchronism. Scaling factors are calculated for each net in the group from the incremental scaling rate of each component and the connectivity of the circuit. The scaling factors indicate the relative rate at which value pixels arrive at each net. The time at which a reference pixel arrives at each net is then computed to ensure that corresponding pixels arrive together at components with multiple inputs. When the circuit is simulated, the start time and finish time for each component is determined, giving the execution time for the circuit. Output data from a group is made available to other groups when the simulated time is advanced to the finish time for the group. Proper timing is thus assured without performing the simulation at the pixel level.

13 Claims, 16 Drawing Sheets

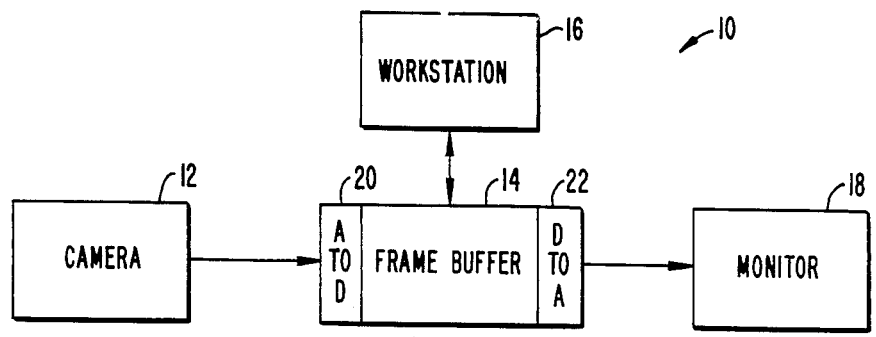
FIG._1.
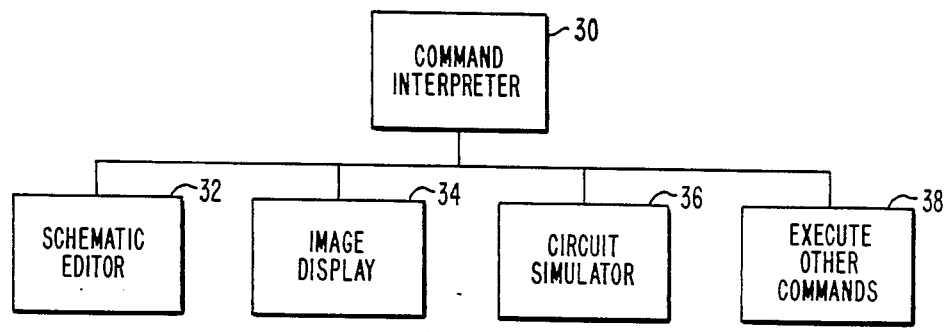
FIG._2.
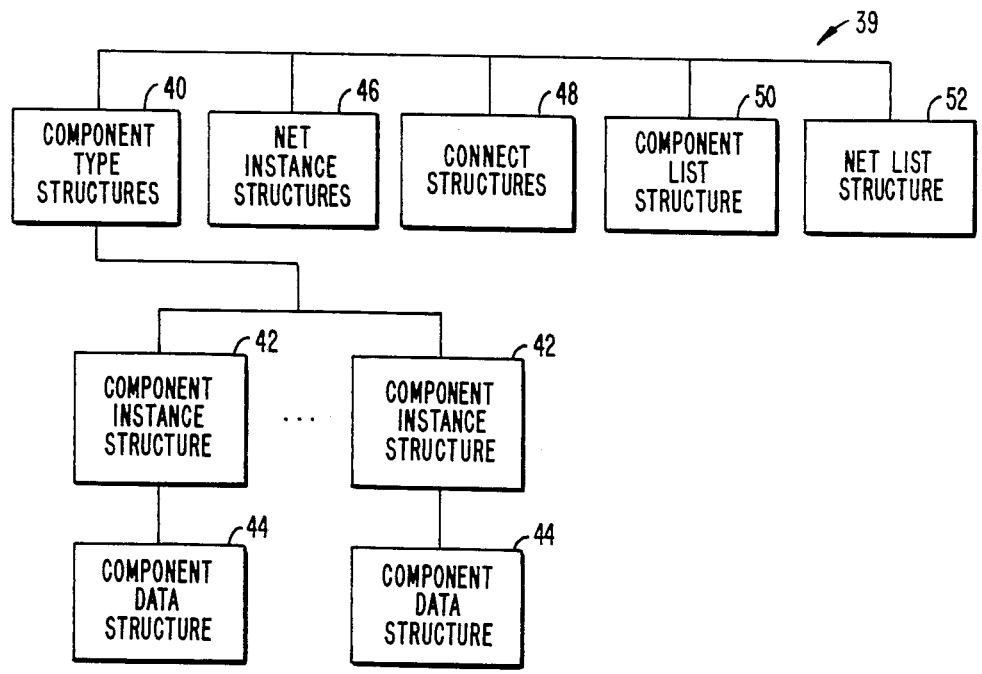
FIG._3.

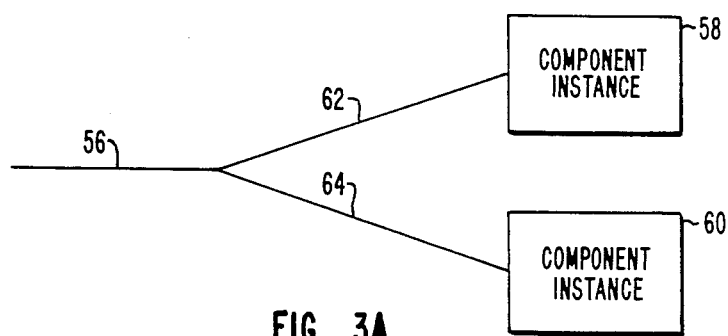
FIG._3A.
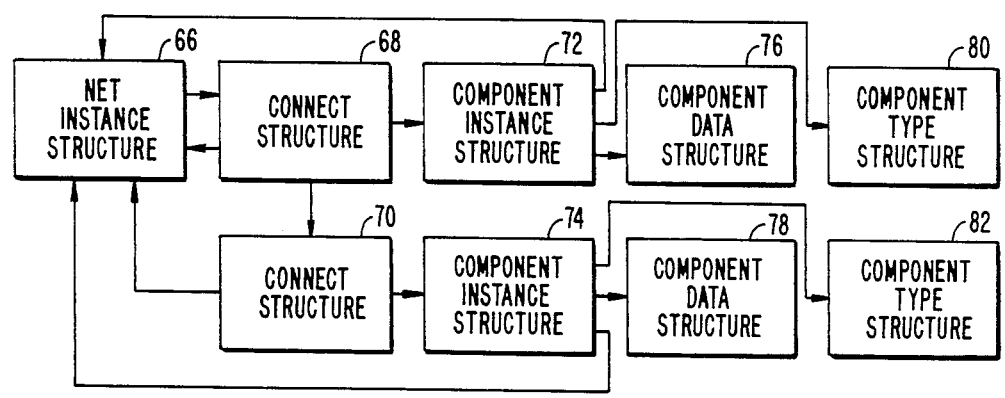
FIG._3B.
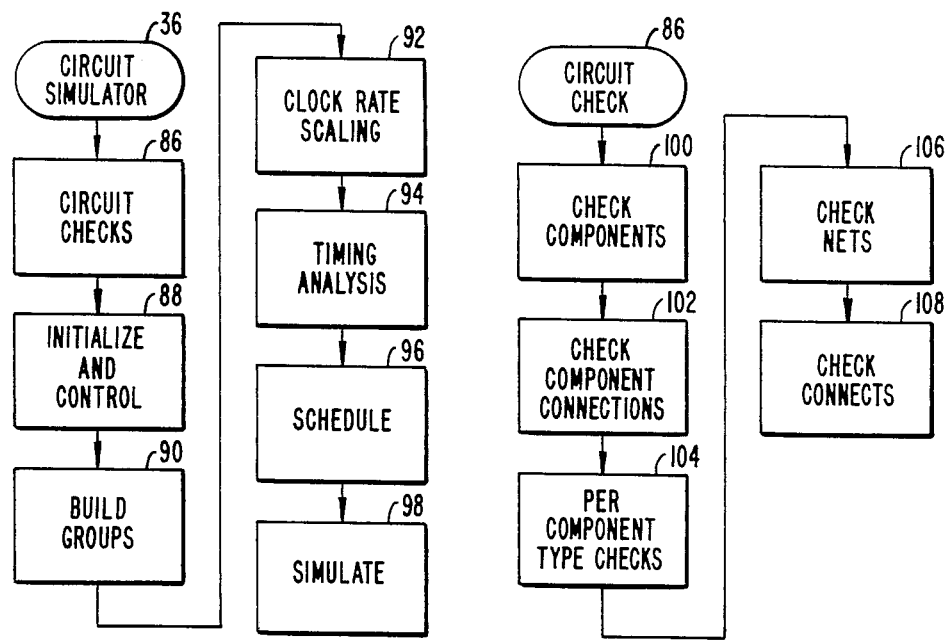
FIG._4.        FIG._5.

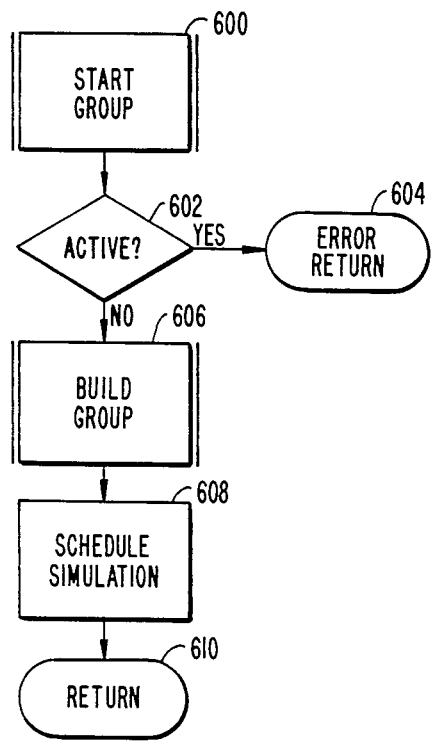
FIG._6.
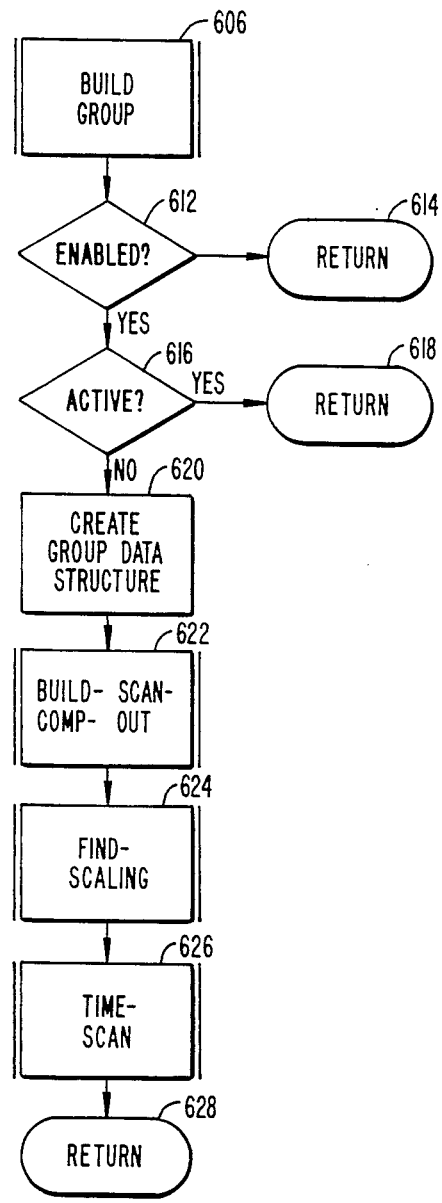
FIG._6A.

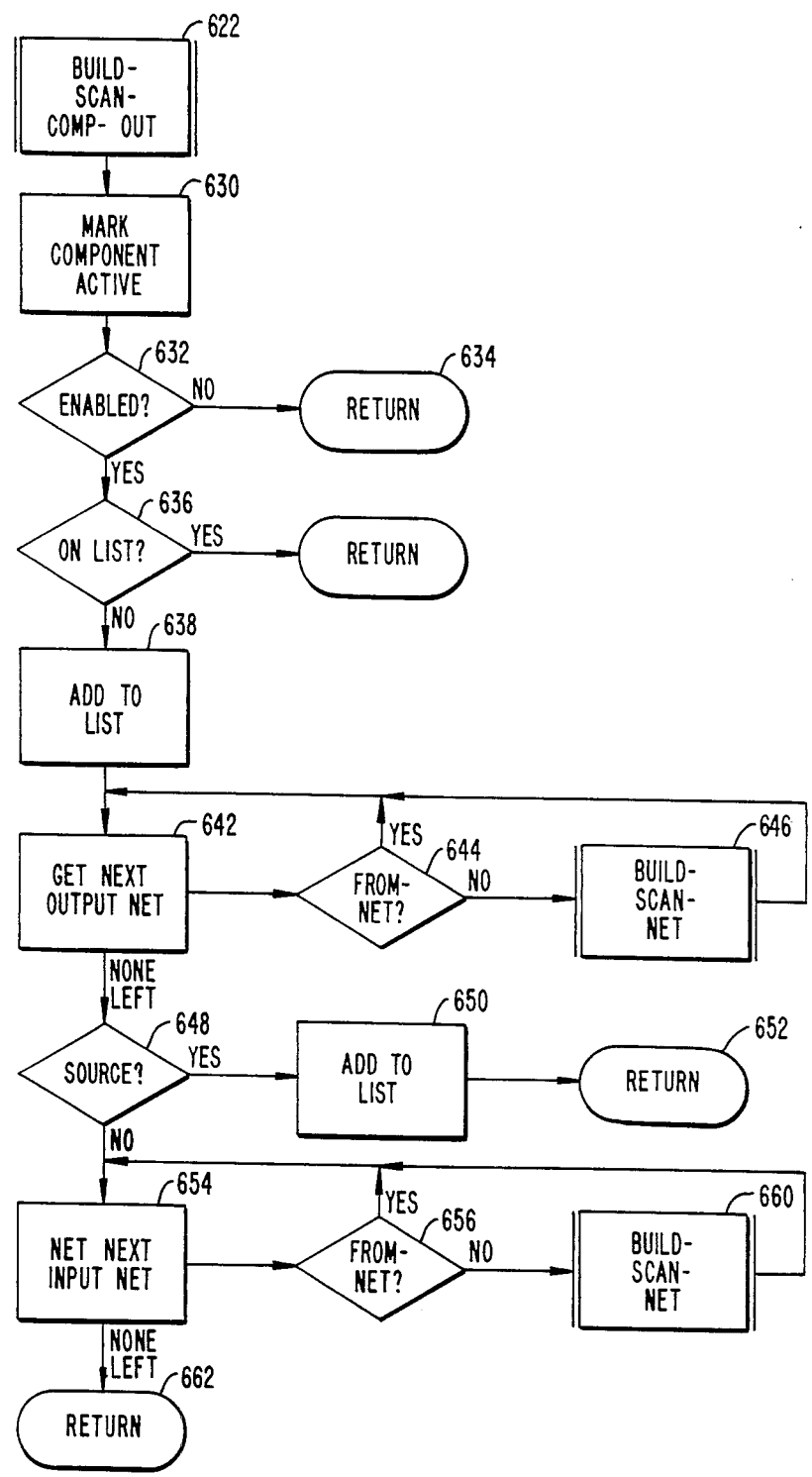
FIG._6B.

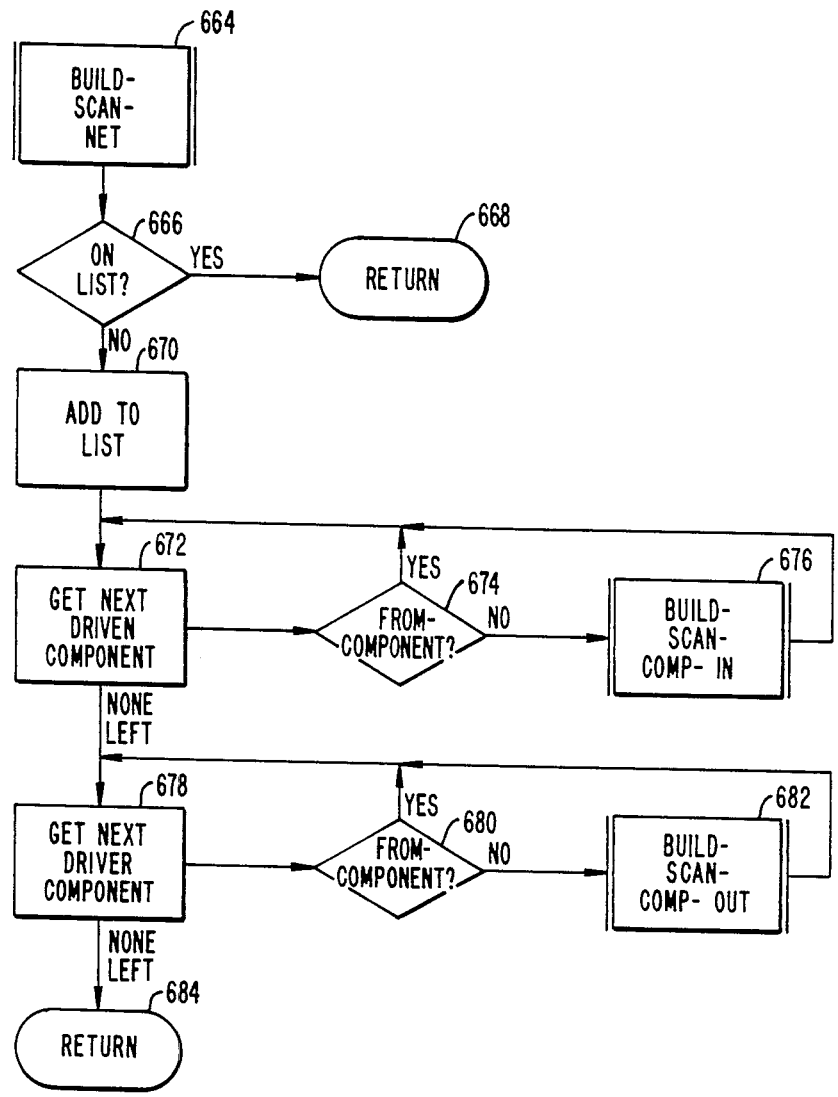
FIG.—6C.

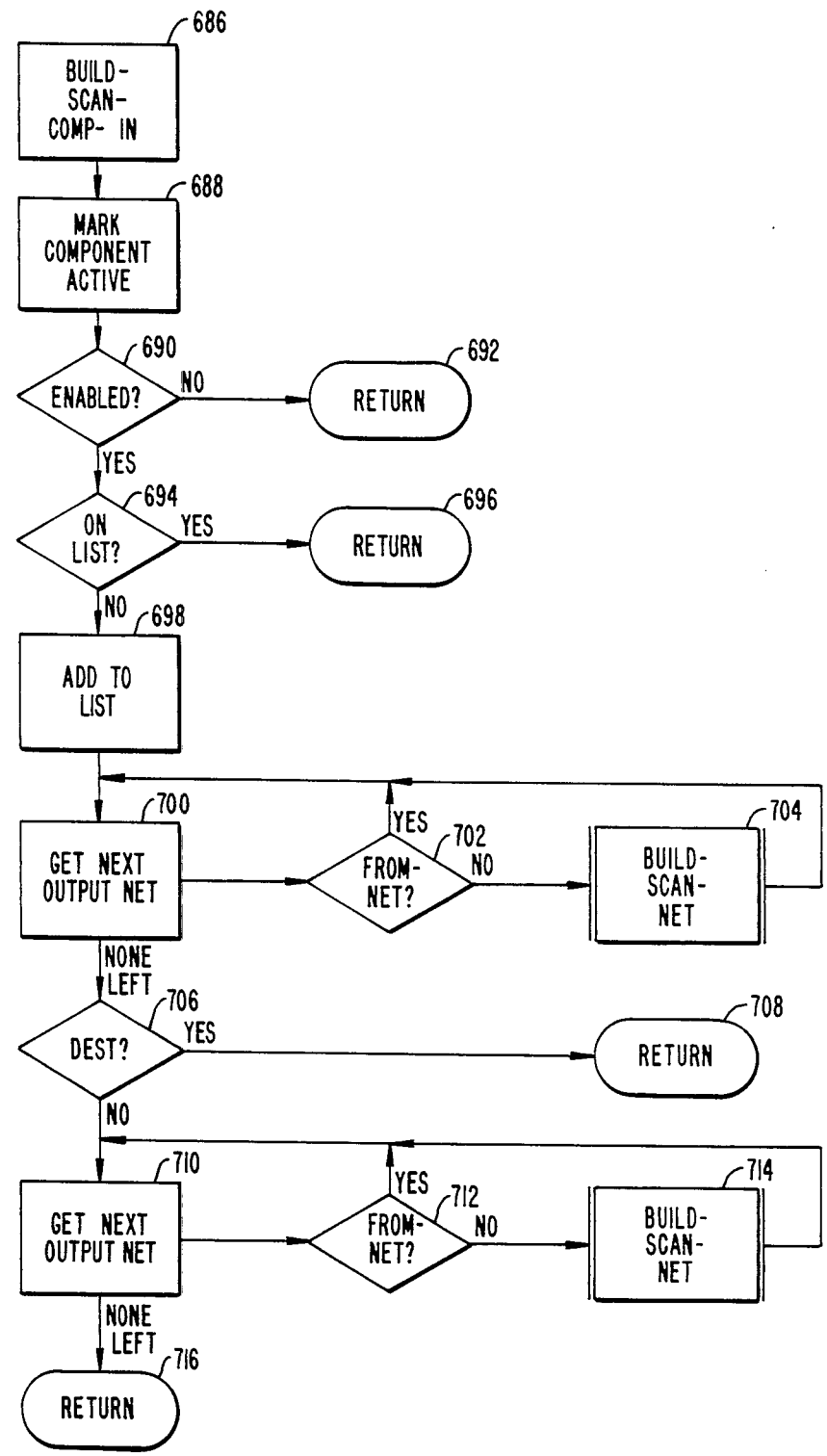
FIG._6D.

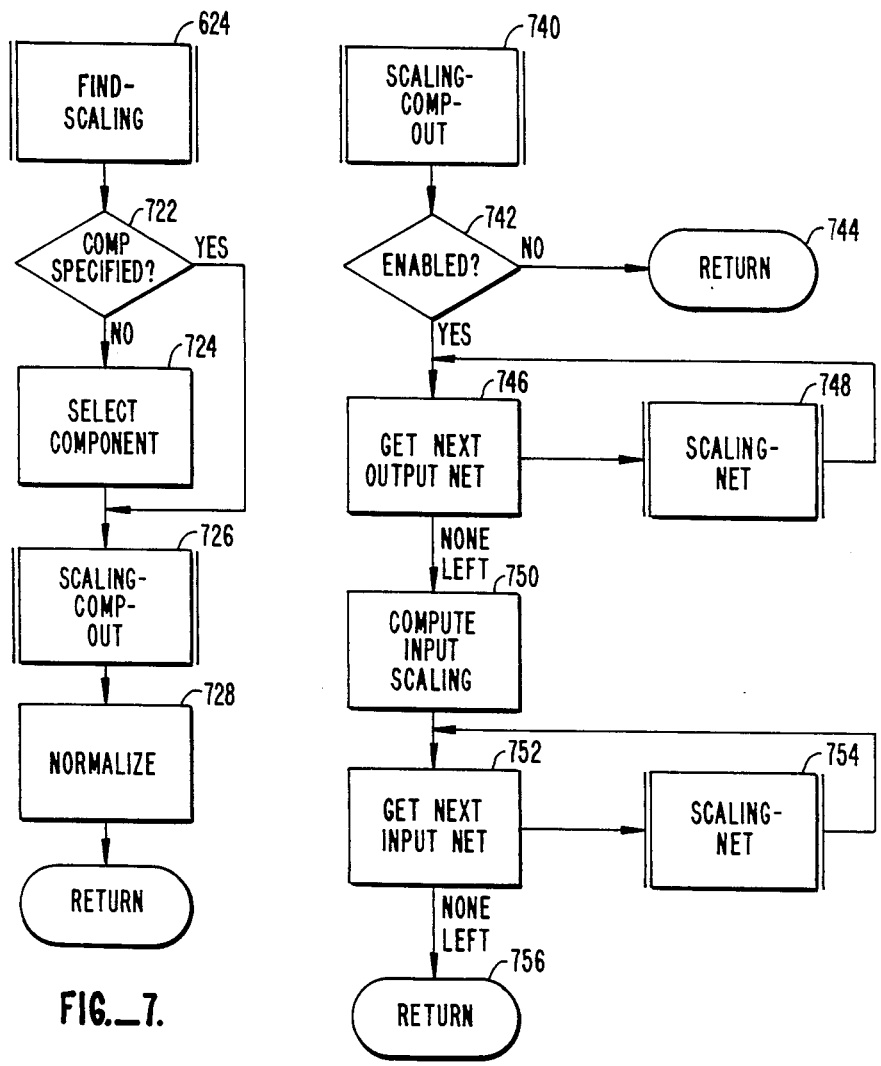
FIG._7.
FIG._7A.

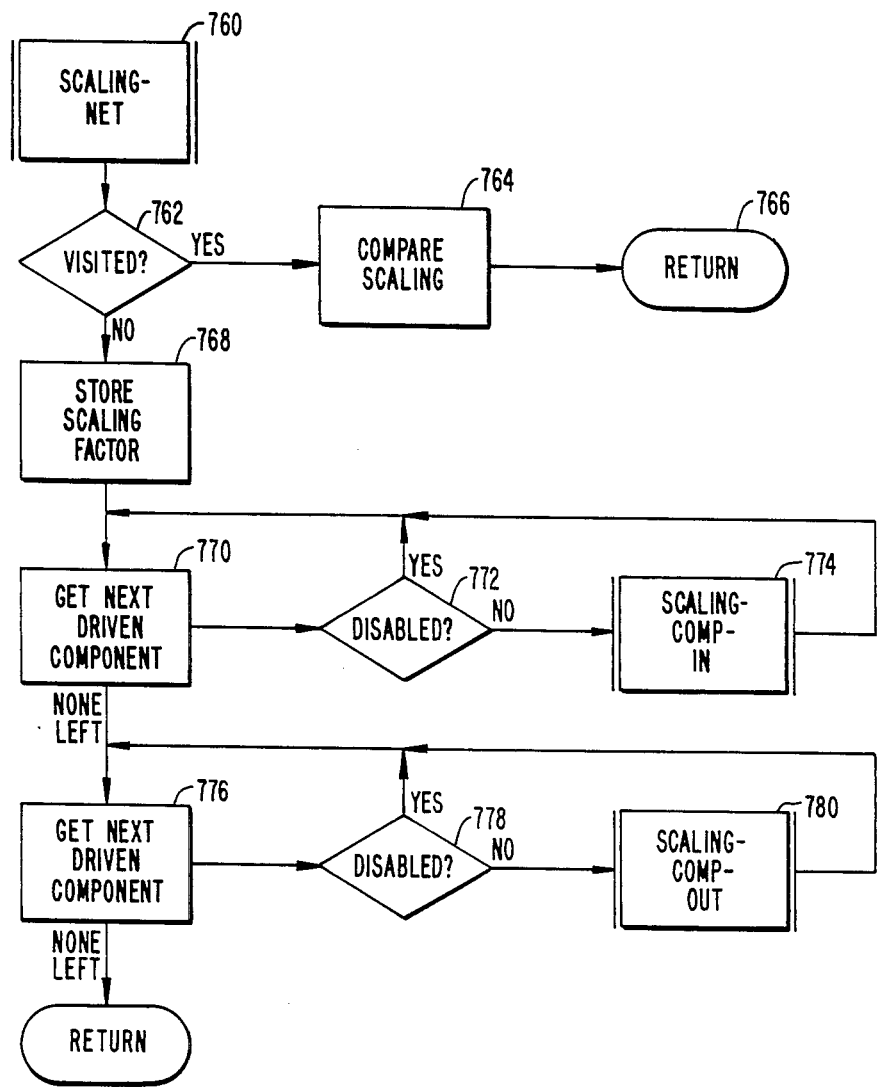
FIG._7B.

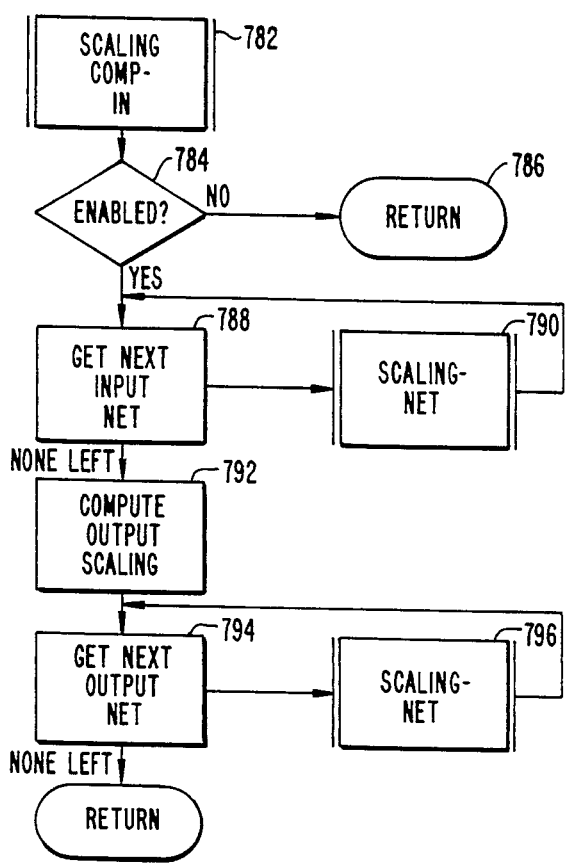
FIG._7C.
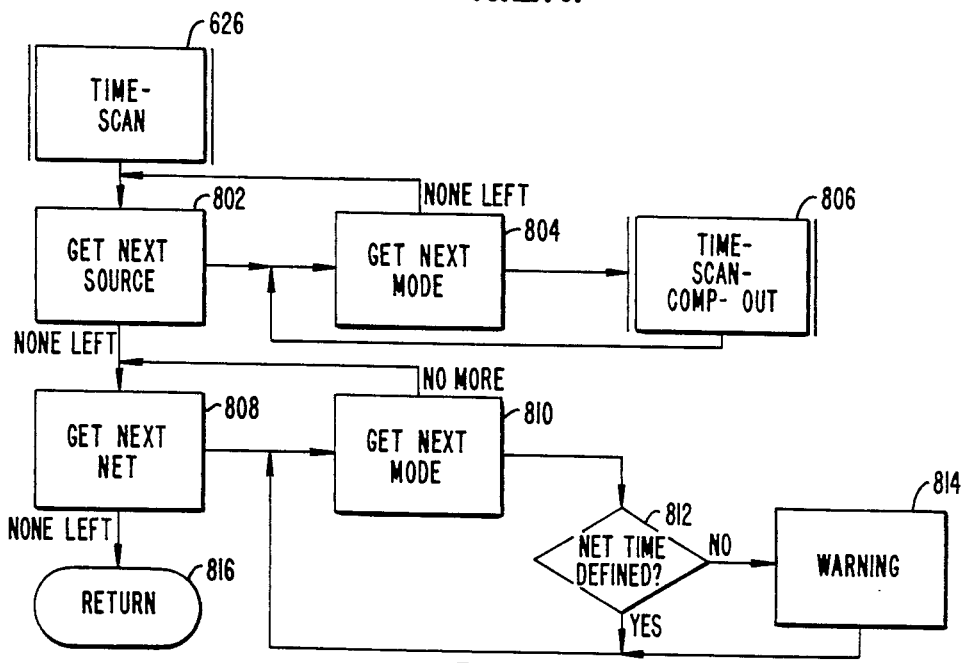
FIG._8.

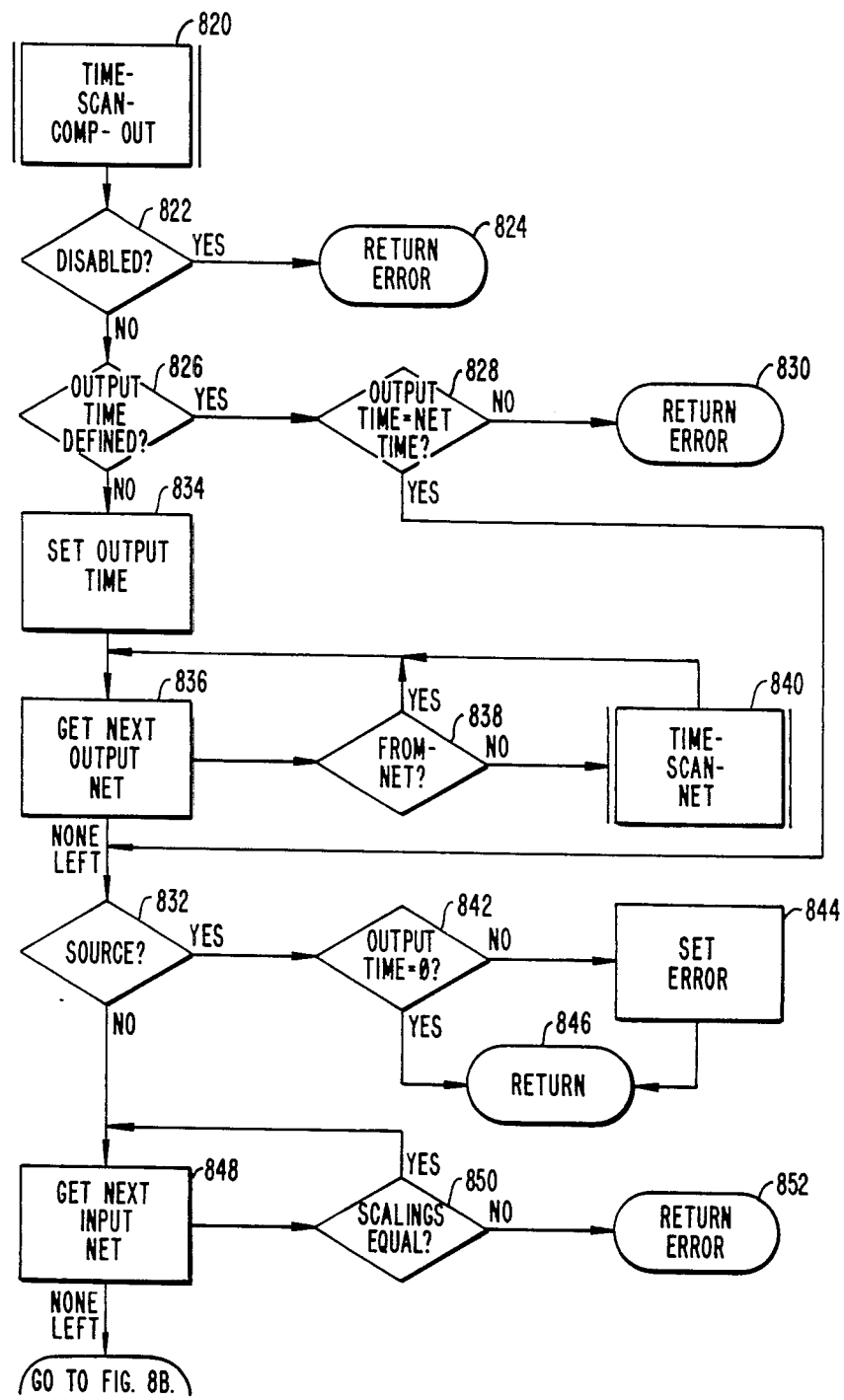
FIG._8A.

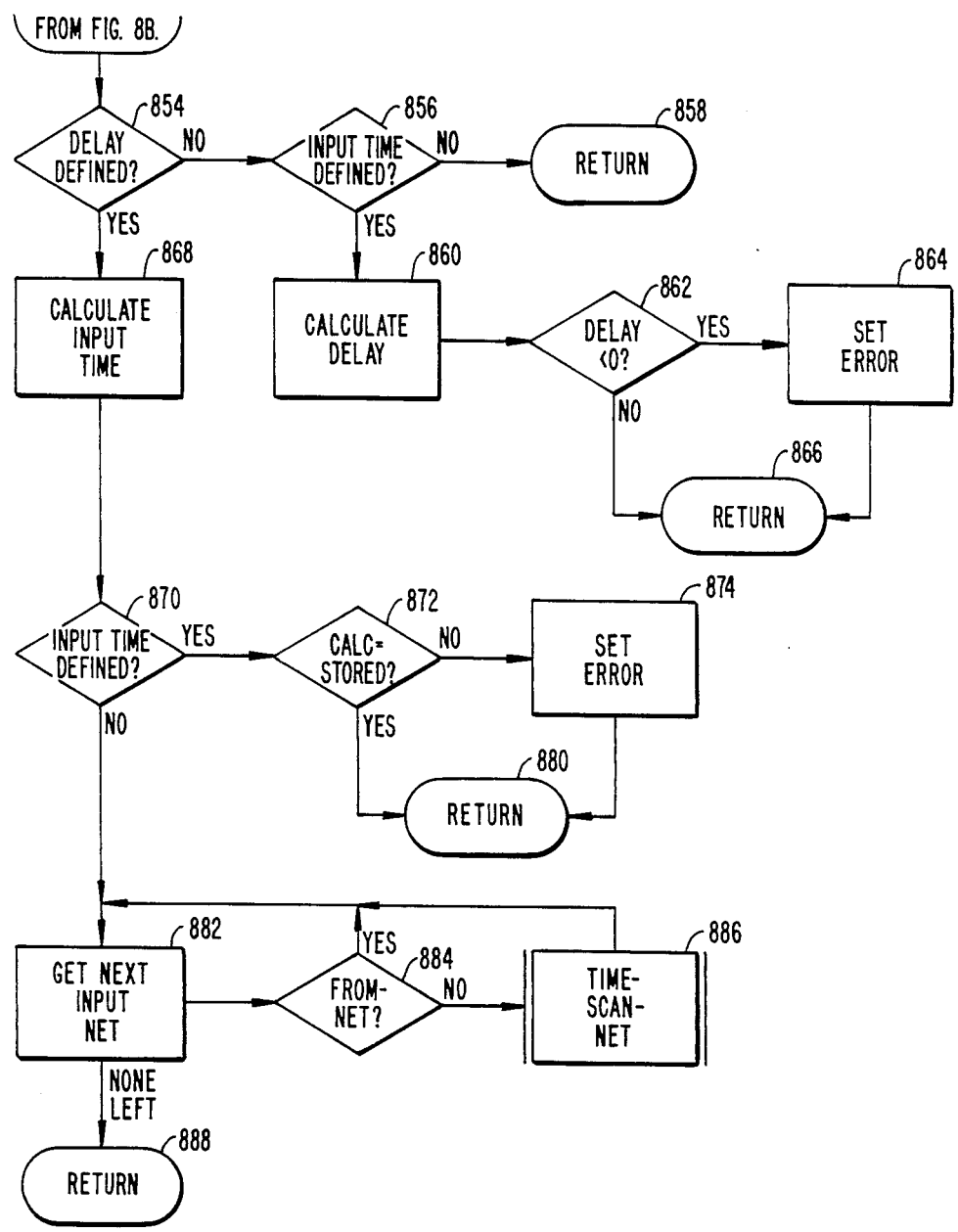
FIG._8B.

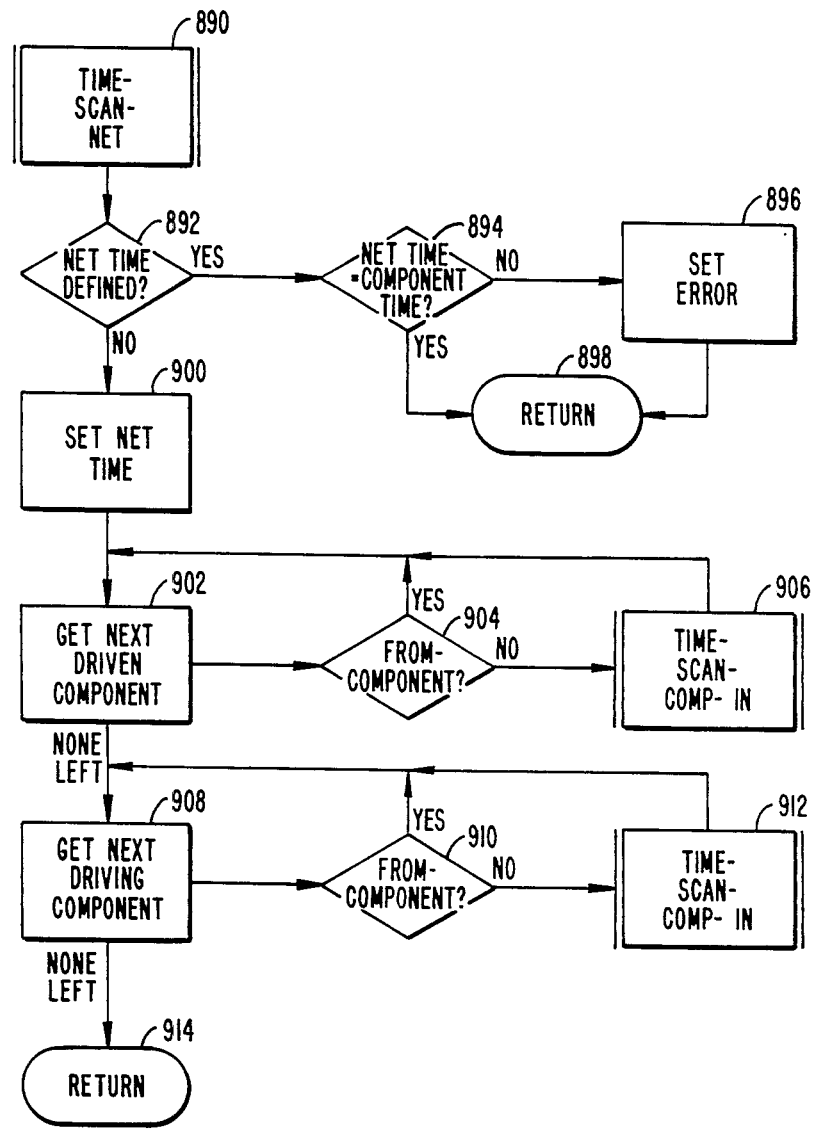
FIG._8C.

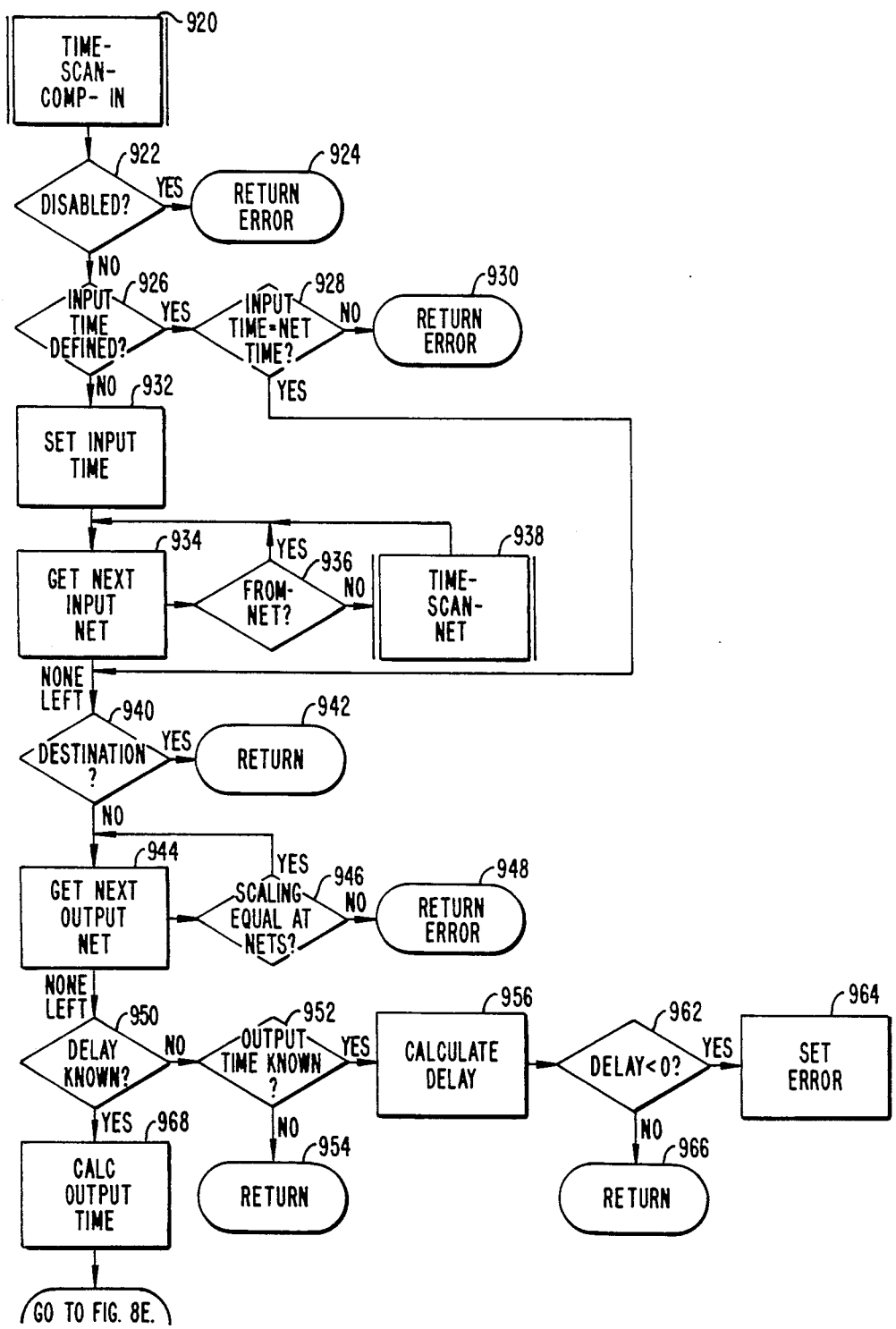
FIG._8D.

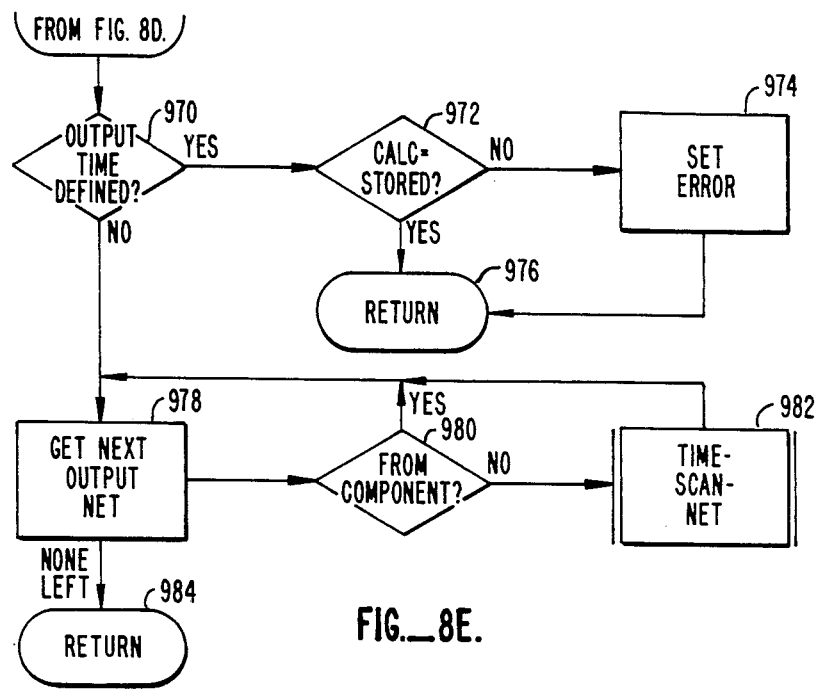
FIG._8E.
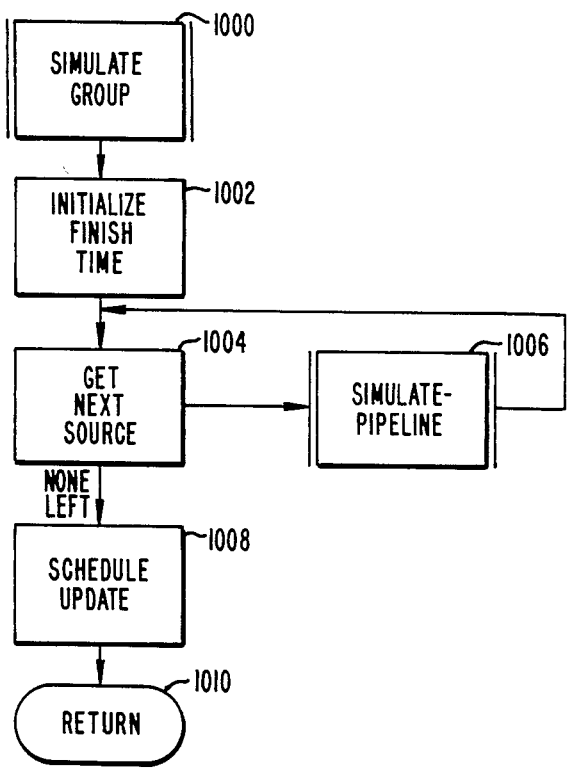
FIG._9.

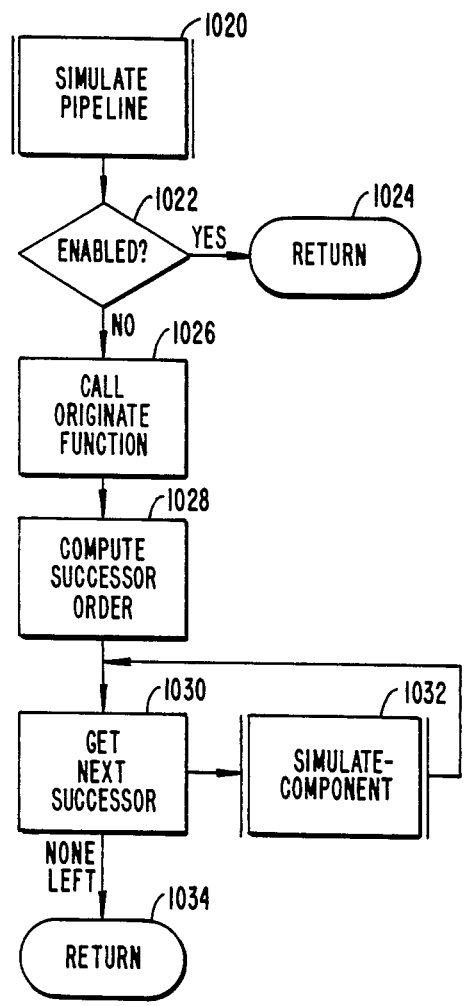
FIG._9A.
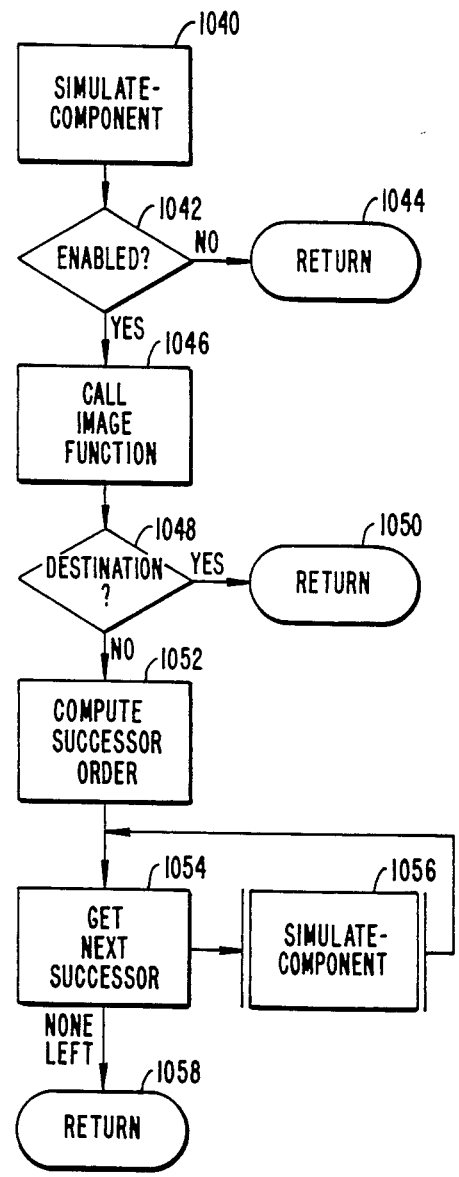
FIG._9B.

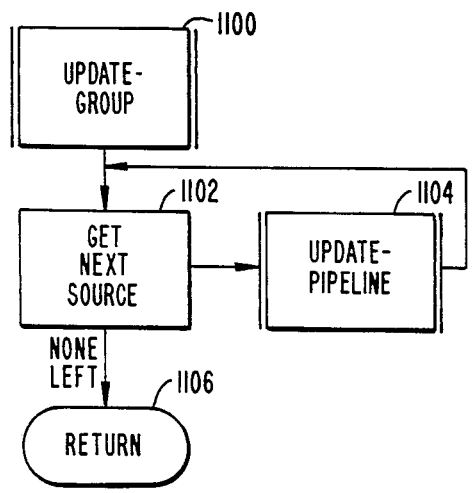
FIG._10.
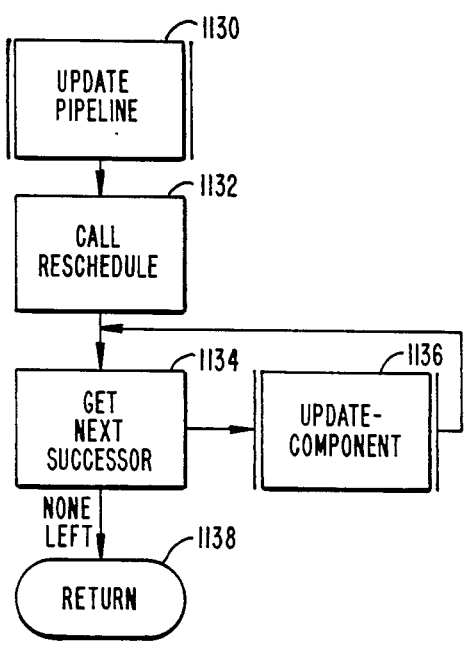
FIG._10A.
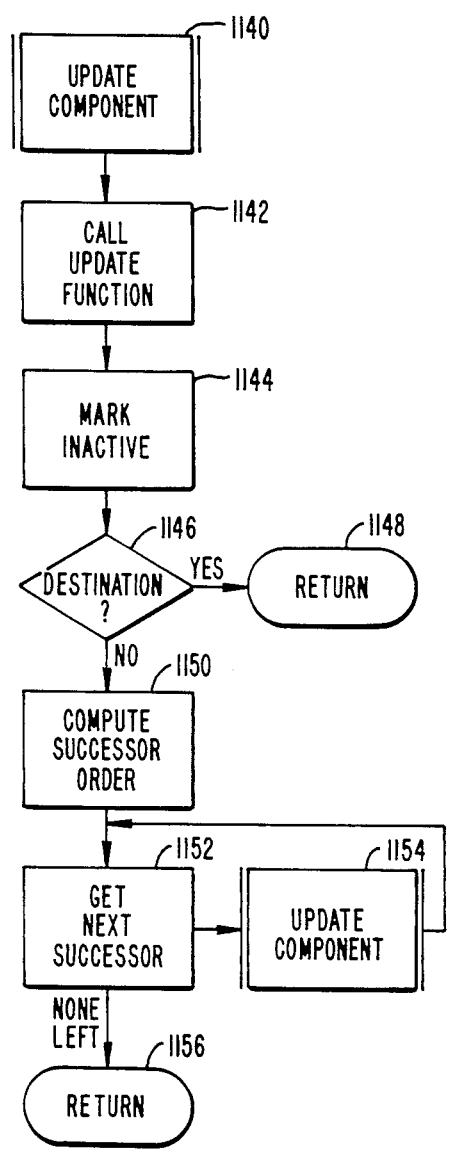
FIG._10B.

SYSTEM FOR SIMULATING ELECTRONIC DIGITAL CIRCUITS

BACKGROUND OF THE INVENTION

1. Field of the Invention

This invention relates to a method and apparatus for simulating the behavior of electrical circuits. In particular, the invention relates to a method and apparatus for simulating, on a computer, the behavior of electronic circuits having high speed, computationally intensive pipelined components for processing digital data.

2. Description of the Prior Art

Electrical circuit simulators have existed for many years as part of computer-aided circuit design systems. The circuit designer uses simulators to aid in the development of electrical circuits. The simulator models the behavior of a proposed circuit design, usually on a computer, without requiring the acquisition and interconnection of the particular discrete circuit components.

Some simulators allow the designer to analyze a high level functional model of the circuit, by computing the results of a particular set of processing operations on vectors of data elements, without regard for timing details such as whether data elements arrive at components in synchronization, or the time that the processing operations will take. This model is efficient to execute on a computer and is useful at the early stages of design.

Lower level simulation models provide the detailed timing analysis at the data element level which is necessary to verify that the circuit will actually work as desired and to determine how long it will take. A conventional simulator which provides details at the data element level normally operates at the data element level. In such simulators, a variable is used to indicate the current simulated time. All events which occur at this time are simulated before the time variable is advanced to the next time. The speed and capabilities of modern digital circuits make it very inefficient to simulate the behavior of such circuits in this manner, particularly on sequential processors.

In pipelined digital systems, signals representing discrete data elements flow through a sequence, or pipeline, of processing components in turn, being transformed at each stage. At any time, many different components are actively processing different data elements. Parallel paths in the circuit may also be active at the same time processing the same or different data elements. If a system simulates a pipelined system in the conventional manner, it simulates all of the processing of data elements which occurs at each component at a specific time. Then, it advances its time variable to the next simulated time and simulates the processing of the data elements which have been transformed at the previous times. The computational overhead of routing the data elements from each output of each component to the inputs of its successor components is incurred for each active component at each advance of simulated time. The simulator must determine the correct inputs to the correct successor components by searching the data structures which describe the circuit components and their connections.

The programming code to route the data elements from component to component in a conventional prior art simulator is substantially large compared to the code to simulate the actual processing of data elements. If data element routing is performed for each data element which is output from each active component, only a small fraction of computer processing time is spent replicating the processing of data elements. This inefficiency can seriously degrade the performance and increase the effective costs of the simulation. For circuits having parallel pipelines of high speed, computationally intensive components, the costs and elapsed time of such a simulation process limits its effectiveness as a design aid.

SUMMARY OF THE INVENTION

A simulator for electronic digital circuits is provided which combines the efficiency of a high level functional simulation with the detailed timing analysis which has heretofore been provided only by simulation at the data element level. The inefficiencies of routing individual data elements from component to component at each time increment are avoided by routing entire vectors of data elements. The processing at each component is simulated for an entire vector of data elements before the processing of a vector by the next component is simulated. The substantial reduction in computational overhead which is achieved by routing vectors instead of data elements makes it possible to perform very extensive calculations to discover how the simulation would have performed at the data element level. It is thus possible to ensure that the circuit works at the data element level and to calculate the time that the actual processing will take.

According to the invention, the processing of a vector of data elements by each component in a synchronous group is simulated and any output vectors are stored for access by other components. As each component is simulated, a finish time for the component is calculated. The timing of the group is synchronized by ensuring that signals representing corresponding data elements will arrive together at components having multiple inputs.

According to a further aspect of the invention, the simulation of a plurality of independently synchronized groups is possible. The invention ensures that data generated by the simulation of each group is made available only to those other groups which will start processing after the first group is finished.

In the preferred embodiment described herein, an apparatus and method are described for simulating the behavior of circuits having high-speed, computationally intensive components for processing visual image data. A frame of image data is input from a video camera and the output of the simulated processing is displayed on a monitor. The results of the detailed timing analysis are reported to the designer. By utilizing the novel techniques taught by this invention, the inefficiencies of conventional simulators are avoided without the loss of critical timing detail.

BRIEF DESCRIPTION OF THE DRAWINGS

FIG. 1 is a block diagram of a preferred embodiment of an apparatus for simulating the behavior of a circuit for processing digital visual image data;

FIG. 2 is a block diagram illustrating the major functional blocks of the simulation system;

FIG. 3 is a block diagram of the internal data structures which describe the circuit to be simulated;

FIGS. 3A–3B are illustrations of a circuit segment and the corresponding data structures;

FIG. 4 illustrates the high level functional flow of the circuit simulation function;

FIG. 5 is a flow chart illustrating the circuit checking function for editing the schematic diagram of the circuit to be simulated;

FIGS. 6 and 6A-6D are flow charts of the function which determines of the group to be simulated;

FIGS. 7 and 7A-7C are flow charts of the function which calculates the scaling factors at each net;

FIGS. 8 and 8A-8E are flow charts of the timing analysis function;

FIGS 9 and 9A-9B are flow charts of the group simulation function;

FIGS. 10 and 10A-10B are flow charts of the post-simulation update function. de

DESCRIPTION OF PREFERRED EMBODIMENT

The present preferred embodiment of the invention will now be described in detail with reference to the accompanying drawings. In this embodiment, the circuit to be simulated consists of specialized VLSI components for visual image processing and computer vision applications. A description of typical visual signal processing (VSP) components simulated in this embodiment is included in Appendix A.

In the context of visual signal processing, input and output vectors are referred to as frames, and data elements are referred to as picture elements, or pixels. The digital representation of a visual image is a rectangular frame of pixels, where each pixel is a discrete rectangular area within the frame having a value corresponding to the brightness of the image over that area.

FIG. 1 is a block diagram of a typical embodiment of an apparatus 10 for simulating the behavior of circuits which process digital visual image data. The apparatus comprises video camera 12, frame buffer 14, workstation 16 and video monitor means 18. Frame buffer 14 incorporates analog-to-digital converter means 20 and digital-to-analog converter means 22. The analog output signal of video camera 12 is coupled into analog-to-digital converter means 20 and converted to digital form. Frame buffer 14 is coupled to workstation 16 so that workstation 16 can read from and write to frame buffer 14. The analog output of digital-to-analog converter means 22 is supplied to grey-scale monitor means 18 for display.

Workstation 16 is typically a programmable digital computer having a monitor with a bit map display, and user interface means such as a keyboard and/or a "mouse." For example, a "Sun 2/160" workstation from Sun Microsystems, Inc. of Mountain View, Calif. may be used. Frame buffer card VG-121 from Data Cube Inc. of Peabody, Mass. may be used with this workstation. The frame buffer contains control logic to accept a continuous stream of image data, to capture one frame upon receipt of a command from workstation 16, and to generate a continuous stream of image data for display by repeatedly displaying the image stored in the frame buffer.

A user interfaces with the system by interacting with the workstation display in a graphical manner. Using a mouse or other pointing device, the user places component icons on a schematic diagram, and draws in interconnections representing pixel bus connections. These component icons represent functional abstractions which can be achieved using one or more VSP chips.

Typically a camera icon will be included in the schematic, corresponding to the real video camera 12. This allows real images to be input to the simulation. Images are transferred between analog-to-digital converter means 20, frame buffer 14, and digital-to-analog converter means 22 as a stream of pixels scanned from the image line-by-line. One digitized image may be captured by the frame buffer 14 and input to workstation 16.

Results from the simulation, if in the form of images, are written to frame buffer 14 and displayed on monitor means 18 by including a monitor icon in the schematic. The image stored in the frame buffer is repeatedly output to digital-to-analog converter means 22 and displayed on monitor means 18. An analysis of the timing behavior may be displayed at workstation 16.

Rather than including a camera icon in the schematic, the user may include a different icon which will cause digitized images to be read from digital storage means. Similarly, results may be written to digital storage means using a file writing icon.

Workstation 16 is programmed according to the invention to accept and simulate the circuit entered in schematic form by the user. The block diagram of FIG. 2 illustrates the major functional blocks of the simulation system. Command interpreter 30 accepts commands entered from the keyboard, or selected from a menu with the mouse. When a valid command is accepted, command interpreter 30 calls the appropriate function to execute the command. Schematic editor 32 is called for accepting, editing and storing schematics entered by the user. One of the commercially available schematic capture programs may be used for the schematic editor. Image display subsystem 34 is called to execute commands which allow the user to interact with the image displayed on one or more monitors. The circuit simulator 36 is called to simulate the behavior of the circuit using parameters set by the user. Other user commands are executed by functional block 38 to perform such functions as saving and loading data files and controlling debugging options.

FIG. 3 is a block diagram of the internal data structures 39 used in this embodiment to store data describing a circuit in the computer memory in a format which can be used by the circuit simulator 36. These data structures may be constructed directly by schematic editor 32. Alternatively, the data structures may be reconstructed from a file previously created by schematic editor 32.

Several different kinds of data structures are used in this embodiment to represent the circuit components and their interconnections. Those data structures which describe the components include the component-type structures 40, the component-instance structures 42, and the component-data structures 44.

The component-type structures 40 are data structures containing data fields which describe the fixed properties of each type of component. There is one component-type structure for each type of component known to the system. The user may define new types to the system. Fixed properties include the number of input and output pins for each type of component, pointers to the functions which implement the simulation of the component at various phases of the simulation, the component delay and incremental clock rate scaling factors, and various flags indicating such things as whether the component is an independent source or an independent destination.

The schematic of a circuit which is entered by the user typically contains 0, 1, or many "instances" of particular component types. While the fixed properties of these component types need not be repeated for each component instance, properties which are not fixed must be described for each component instance. The component-instance structures 42 and component-data structures 44 contain the variable, or "per-component instance," data. There is one component-instance structure and one component-data structure for each component instance in the schematic. The component-instance structures 42 are data structures containing all of the per-component instance data fields which are relevant to all of the different types of components. The component-data structures 44 also contain per-component instance data, but these structures contain different data fields for each type of component, typically the data fields which are needed to describe the internal state of the component instance.

Pointers are used to link the component-instance structures 42 to the appropriate component-type structure 40 and component-data structures 42. Together, these data structures describe all of the fixed and variable properties of a particular component instance without redundancy.

The net-instance structures 46 are data structures containing data fields which describe the interconnections between component instances. A net instance represents a bundle of wires, each capable of carrying one bit, plus hand-shaking and clock connections. The connect structures 48 are data structures containing data fields which describe the way in which component instances are connected to the net. The connect structures 48 also describe how and which bits of the net are connected to the component instance. One or many components may drive bits of the net, and one or more components may be driven by the net.

FIGS. 3A and 3B illustrate how pointers in the data structures are used to describe a segment of a typical circuit. FIG. 3A shows a circuit segment containing one net 56 driving two component instances 58 and 60, via connections 62 and 64. FIG. 3B illustrates the corresponding data structures and pointers. Net-instance structure 66 points to one connect structure 68. The connect structures 68 and 70 represent connections 62 and 64 connected to one end of net 56 and are linked by a pointer. The connect structures also point to the component-instance structures 72 and 74, and to the net-instance structure 66. The component-instance structures 72 and 74, representing component instances 58 and 60, point to the net-instance structure 66, component-data structures 76 and 78, and component-type structures 80 and 82.

Returning to FIG. 3, it is seen that the internal data structures also include component-list structure 50 and net-list structure 52. As each new component-instance structure is allocated it is added to the component-list data structure 50. This allows all of the components in the circuit to be visited once by traversing the list, rather than having to follow the connectivity of the circuit. Similarly the net-list structure 52 contains a list of all the net-instances in the circuit.

The logic of the simulation function will now be described with reference to FIGS. 4–10C. Component instances generally will be referred to as components in this description.

FIG. 4 illustrates the high level functional flow of the simulation function 36. The circuit checking function 86 edits the internal data structure representation of the circuit for completeness and for compliance with specific design rules. If the circuit passes all of the checks without any problems, the initialization and control function 88 performs component configurations and controls the actual simulation of groups of components. The control function requests the simulation of a group of components by specifying a component. The build-groups function 90 then determines which other components are members of the same group. A group of components is defined as a set of components which must operate in synchronism. Clock rate scaling function 92 traverses the components in the group to compute clock rate scaling factors for each net. Timing analysis function 94 computes the relative timings around all of the component instances in a group and resolves delays for variable delay components. The group is then scheduled (96) for simulation. Eventually, the simulation function 98 simulates the behavior of the group. Each of these functions will now be described in greater detail.

Referring to FIG. 5, the circuit checking function 86 first performs component checks at block 100. This function checks that the component list is not null, that each element in the component list is a valid component, and that each component-instance has a valid pointer to a component-type structure. At block 102, each component is checked to verify that it has all of its inputs and outputs connected to exactly one net, and that the net is in the net list. At block 104, any special per component type checks are performed. At block 106, the check nets function checks that the net list is not null, that each net is driven by at least one component and that each net drives at least one component. At block 108, the connect structures are checked to insure that they are correctly linked to the component and net-instance data structures. Any errors detected by circuit checking function 86 are reported back to the user. If no errors are detected, execution proceeds to the initialization function (FIG. 4, block 88).

In the real system which is simulated by the simulator described in this embodiment, execution is controlled by a control program supplied by the user. This program is executed on a control processor connected to each of the components. In the simulator, this control program may default to the virtual program, contained in the simulator. Alternatively, the user may supply actual program code to replace all or part of the virtual program. The user code is linked into the simulator and executed on the same processor that executes the simulation.

The user code performs initialization function 88. Components are configured by calling functions which are provided in the simulator which interact with the simulation of components, allowing component modes and behaviors to be controlled just as if the code were accessing the real hardware. If any component is not configured by the user code, a default configuration is effected by the virtual program.

The control program next prepares groups of components for simulation by calling the start-group function to prepare and schedule a particular group of components for execution. Referring to FIG. 6, the start-group function 600 is illustrated. This function is called with a pointer to a component instance structure (normally for a source component, such as a camera). At block 602, a test is made to determine if the specified component is a member of a group which is already marked active (either because it has just been scheduled or because it has not finished execution from some previous scheduling). If the component is active, control returns to the caller at block 604 with an error indicator. Otherwise, at block 606, the build-group function is called to compile a list of all of the components and nets in the group containing the specified component. When control returns to the start-group function, the scaling and timing functions will have been executed, and, at block 608, the defined group is scheduled for simulation. Control then returns to the control program at block 610.

A group of components is a set of connected components which must operate in synchronism. A group is delimited by components which have no pixel input (e.g. cameras), components which have no pixel output (e.g. correlators), or components which have both an input and an output but where the input and output are completely independent (e.g. the frame buffer component). Disabled components are considered as components with no output and thus as destination components. Groups must be recompiled at every rescheduling because the extent of the group may vary if components are disabled. Since the control program can alter the enabled or disabled stated of each component, it could alter the effective connectivity of the circuit and hence the extent of groups of components within a circuit.

The build-group function 606 is illustrated in FIG. 6A. The build-group function 606 performs a recursive walk over the circuit data base to discover the extent of the group and build a list of components and nets in the group. It is called with a pointer to a component-instance structure. At block 612, a test is made to determine whether the specified component is enabled and, if not, at block 614, control returns to the calling program with an error indicator. At block 616, a test is made to see whether the specified component has been marked as active. An active component is one that is part of a group that has been scheduled for execution and has not completed execution. At block 620, a new group data structure is created. The build-scan-comp-out function is then called at block 622, to start the recursion. When control returns to the build-group function the group will have been defined. The build-group function will, at block 624, call the clock rate scaling function for this group. Then, at block 626, the timing analysis function is called for this group. At block 628, control returns to the start-group function.

Referring to FIG. 6B, the build-scan-comp-out function 622 is illustrated. This function is called with pointers to a specific component, the group list, and a "from-net." The from-net is an indicator of the net which was traversed to arrive at this component, and is used to avoid recursing indefinitely around a loop of components. (This parameter is null on the first call for a source component.) At block 630 the specified component is marked as active. At block 632, a test is made to determine whether the component is enabled; if not, control returns to the caller at block 634. If the component is not disabled and it is not already on the group list (block 636) then, at block 638, the component is added to the group list. Then, at blocks 642 and 644, for each of the nets connected to the outputs of this component, a test is made to determine whether this net is the from-net and has therefore already been traversed. If it is not, then, at block 646, the build-scan-net function is called for this net. Then, if this component is an independent source component (block 648), it is added to the list of source components at block 650 and control is returned to the calling program at block 652. Otherwise, at blocks 654 and 656, for each of the nets connected to the inputs of the specified component, a test is made to see whether this net is the from-net. If it is not, the function build-scan-net is called at block 660 for this net. When all of the input nets for this component have been examined, control is returned to the calling program at block 662.

Referring to FIG. 6C, the build-scan-net function 664 is illustrated. This function is called with pointers to a particular net, a "from-component" (indicating the component from where this net was followed) and the group list. If this net is already on the group list, (block 666) control is returned to the calling program at block 668. Otherwise, at block 670, the net is added to the group list. Then, at blocks 672 and 674 for each of the components driven by this net a test is made to determine whether this component is the "from-component", in which case the component has already been visited, and it is ignored. Otherwise, at block 676 the function build-scan-comp-in is called for this component. Then, at blocks 678, 680 and 682, for each of the components driving this net, if it is not the from-component, the function build-scan-comp-out is called. Control returns to the calling program at block 684.

Referring to FIG. 6D, it will be seen that the build-scan-comp-in function 686 is symmetrical to the build-scan-comp-out function. It is called with pointers to a specific component-instance, the group list, and a from-net. At block 688, the specified component is marked active and at block 690, a test is made to determine whether the component is enabled. If not, control is returned to the caller at block 692. Otherwise, at block 694, the group list is checked to determine whether this component is already on the group list, and, if it is, control returns to the caller at block 696. Otherwise, at block 698, the component is added to the group list. Then, at block 700 and 702, for each of the nets connected to the inputs of this component, a test is made to see whether it is the from-net and has already been visited. If it has not been visited, the function build-scan-net is called at block 704 for this net. If this component is an independent destination component, (block 706) control is returned to the calling program at block 708. Otherwise, at blocks 710 and 712, and 714, for each of the nets connected to the outputs of this component a test is made to see if it has already been visited, and, if not, the function build-scan-net is called. When all of the nets connected to this component have been examined, control returns to the caller at block 716.

In this manner, the functions build-scan-comp-in and build-scan-comp-out are invoked for all of the components in the specified group so that when they have all returned, the group list structure contains a list of all of the components and nets in the group and all of the source components in the group.

When control returns to the build-groups function, it calls the find-scaling function. This function traverses the components in the group again, in exactly the same manner as the build-group functions above, but this time to compute the clock rate scaling factors for each net.

A common clock is connected to all of the components in the group. The clock rate scaling factor describes the ratio of clock cycles to valid pixels at each net in a group. For each group there is a single clock rate which is the fastest rate at which pixels can flow from component to component. At many nets in the group, valid pixels must necessarily flow more slowly than this maximum rate. Components in the group may produce one output pixel for each input pixel, a single output pixel for a number of input pixels, or a number of output pixels for a single input pixel. If a component outputs one pixel for every two incoming pixels, then the output net will exhibit half as many valid cycles as the input net. Likewise, if a component outputs two pixels for every one pixel input, then the input net will exhibit half as many valid cycles as the output net, to leave enough time for the component to output all of its valid output pixels. The clock rate scaling factor is a vector quantity with three components: the line rate scaling factor, the pixel rate scaling factor and the clock scaling factor. The clock scaling factor is the number of clock cycles per clock cycle and is therefore always unity. The pixel rate scaling factor is the number of clock cycles per valid pixel, and therefore must be greater than or equal to unity. The line rate scaling factor describes the number of line cycles per valid line, where a line cycle is defined as the clock cycle time multiplied by the pixel scaling factor and by the line length of the image. It is also greater than or equal to unity.

An incremental scaling factor parameter associated with each component instance is set when the component is configured and stored in the component-instance data structure. The incremental scaling factor is a vector quantity giving the ratio of the output net scaling factors to the input net scaling factors. For example, a component which outputs one pixel for every two input has an incremental pixel scaling factor of two.

Scaling factors must be identical at each point in the group where nets converge. Therefore, components with multiple inputs must have the same scaling factors on each of their input nets. Similarly, components with multiple outputs must have the same scaling factors on each of their output nets. The clock rate scaling functions propagate the scaling factors from net to net using the incremental scaling factors for each component. The group is traversed in the same recursive manner as the build-group functions described above.

Referring to FIG. 7, the find-scaling function 624 is illustrated. References to scaling factors are to the vector quantities described above. The find-scaling function is called by the build-group function with a pointer to a group list. The group list contains a list of all of the components and nets in a group. At block 722, the find-scaling function examines all of the source components in the group to see whether the user has specified an absolute scaling factor for any of the source outputs in the group. If no specified scaling factor is found, then an arbitrary component is selected and a scaling factor of one is assumed. Otherwise, the specified component and rate are used as a starting point. At block 726, the function scaling-comp-out is then called to begin the recursive walk through the group from the selected starting point. When control is returned to the find-scaling function at block 728, the scaling factors are normalized. If a fractional scaling factor was assigned at any net, then the scaling factors of the whole group are divided by the smallest scaling factor to make them all greater than or equal to unity. This insures that there is never more than one pixel passed per clock cycle. A warning message is issued if the real circuit will not behave properly under the settings and conditions imposed by the user.

FIG. 7A illustrates the scaling-comp-out function 740. This function is called with pointers to a component, a from-net and a scaling factor. If the component is not enabled (block 742) control is returned to the calling program at block 744. Otherwise, at blocks 746 and 748, the scaling factor is propagated to all of the output nets by calling the scaling-net function for each of the output nets connected to this component. At block 750, the input scaling factors are computed for the specified component by dividing the output scaling factors by the incremental scaling factors. Then, at blocks 752 and 754, the newly computed input scaling factor is propagated to all of the input nets of this component by calling the function scaling-net for each of the input nets connected to this component. Control is then returned (at block 756) to the calling program.

The function scaling-net 760 is illustrated in FIG. 7B. This function is called with pointers to a net, a from-component, and a scaling factor. At block 762, a test is made to determine whether this net has been visited before. This is done by determining whether a scaling factor for this net has been defined in the net-instance structure. If a scaling factor has been defined, its value is compared (block 764) to the value to be propagated to determine whether an error condition exists, and control is returned to the calling program at block 766. If this net has not been visited before, the scaling factor for this net is stored in the net-instance structure at block 768. Then, at blocks 770 and 772, for each of the components with inputs connected to this net, a check is made to determine whether the component is disabled. If the component is disabled, it is ignored. If the component is enabled, the scaling-comp-in function is called for this component at block 774. Then, at blocks 776 and 778, for each of the components with outputs connected to this net, a test is made to determine whether the component is disabled and, if it is, it is ignored. Otherwise, at block 780, the scaling-comp-out function is called for this component.

The scaling-comp-in function 782 is illustrated in FIG. 7C. This function is called with pointers to a component, a from-net and a scaling factor. It is symmetrical to the scaling-comp-out function. At block 784, a test is made to see if the component is disabled, and if it is, control is returned to the caller at block 786. Otherwise, at blocks 788 and 790, the scaling factor is propagated to all of the other input nets of this component, by calling the scaling-net function for each of the input nets connected to this component. Then at block 792, the output scaling factors are computed by multiplying the input scaling factors by the incremental scaling factors. At blocks 794 and 796, the newly computed output scaling factor is then propagated to all of the output nets of this component by calling the function scaling-net for each of the output nets connected to this component. After the scaling, the scaling variable in the net-instance structure for each net in the group contains values of the line, pixel, and clock scaling factors for that net.

When control returns to the build-group function from the find-scaling function, time-scan function is called to perform the timing analysis. This is the final pre-simulation phase. The timing analysis function computes the relative timings around all of the components in a group, and resolves the delays for components having variable delays. It checks that all of the fixed delays add up to the same number at the same place for each possible path through the group. Given that the scaling rates are also matched, which has already been enforced by the scaling functions discussed above, this insures that the pixels on each input for multiple input components arrive in synchronism.

When the group is simulated, entire frames of pixels are simulated at each component, stored, and passed from component to component. The timing analysis function provides the detailed evaluation of pixel synchronism which would otherwise be lost by simulating at the frame level.

Some components in the circuit may reduce the size of the image by subtracting pixels or lines. To evaluate synchronism, the concept of a reference pixel, or "first virtual pixel" is useful. The "first virtual pixel" is the first pixel which would have been output if an alteration in size had not occurred, i.e., the first pixel in the largest image in the group. If the time of arrival of the first virtual pixel on each of the input nets of a component with multiple inputs is the same, and the scaling factors are also the same, then all of the corresponding pixels in the images will arrive together, even if one of the images is of a different size than the other.

Generally, the designer wants images to arrive at components with multiple inputs in direct correspondence, i.e., with pixels corresponding to the same location in the frame arriving together. Sometimes an indirect correspondence is desired, e.g., with each line from one input corresponding to the next line from another input. Indirect correspondence is achieved by specifying an offset for a variable delay component (one line of offset in this example). In this case, the simulator will first match the arrival time of the first virtual pixel and then add the offset to the variable delay.

The delay between the input of a pixel to a component and the output of the corresponding pixel is a characteristic of a component in a given configuration. Components may have a fixed delay, or a variarble delay which is set by the user when the real circuit is executed. Component delays are stored in the component-instance structure as vectors with three values: clock delay, pixel delay, and line delay. The timing analysis traverses the group and uses the delays to compute the time (relative to the group start time) at which the first virtual pixel arrives at each net in the group. The pixel delay is multiplied by the pixel scaling factor and the line delay is multiplied by the line scaling factor. The relative times for each net are expressed in terms of clock cycles, valid pixel cycles, and valid line cycles.

The component-instance data structures contain vector variables referred to here as output time and input time. These variables represent the relative time at which the first virtual pixel arrives at all outputs (or inputs) of a component. They are initially undefined and are computed by the timing analysis function. In the following discussion of the timing analysis function, it will be understood that these times are always relative to the starting time of a particular group. Similarly, the net-instance data structures contain a vector variable referred to herein as net time, and it will be understood that the net time represents the relative time at which the first virtual pixel arrives at a particular net. It follows that the net time must match the output time for a component if the net is an output net of the component, or the input time for an input net. The timing analysis will enforce this requirement.

The timing analysis functions will now be described in detail. All function calls are followed by a test of a return code to determine whether the called function has detected an error. In this manner, detected errors will result in warning messages being issued and processing being aborted. The details of return code processing are known to those skilled in the relevant arts.

Referring to FIG. 8, the function time-scan 626 is illustrated. This function is called with a pointer to a group list. At blocks 802, 804, and 806 the function time-scan-comp-out is called for each source component and for each mode. The timing analysis will be repeated for each of the timing modes-clocks, pixels and lines. When time-scan-comp-out has been called for each source component and for each mode, then at blocks 808, 810, and 812, for each net in the group list and for each mode, a test is made to determine whether there are an excessive number of variable delays in the system. This test is done by checking the net time. If the net time is still undefined at block 812, then there are too many variable delays and a warning message is issued at block 814. When the timing analysis is complete, control returns to the calling program at block 816.

The remaining timing analysis functions are all called with a mode indicator and will perform their function on variables for the indicated timing mode. This selection of variables for a particular mode is implied in the following discussion.

Referring to FIG. 8A, the function time-scan-comp-out 820 is illustrated. This function is called with pointers to a component-instance, a from-net and the net time determined by the calling program. The from-net indicates the net which was traversed to arrive at this component and is used to limit the recursion. At block 822 a test is made to determine whether the specified component is disabled. If the component is disabled, control returns to the calling program at block 824 with an error indicator. At block 826, a test is made to determine whether the output time for this component has been defined. If it has, at block 828, the output time is compared to the net time which was passed to this function indicating the net time on the output net. If these times are unequal, then control returns to the caller at block 830 with an error indicator. Otherwise, processing continues at block 832. If the output time at this component is undefined, then, at block 834, output time is set to the value of net time passed to this function. This value will now be applied to all of the other output nets. At block 836 and 838, for each net connected to the output of this component, a test is made to determine whether this output net has been is the from-net. If it is the from-net, then it is ignored. Otherwise at block 840, the function time-scan-net is called, with the output time passed as one of the parameters.

At block 832, a test is made to determine whether this component is an independent source component. If it is, then a test is made at block 842 to determine whether the output time for this component is zero. If not, an error indicator is set at block 844. Control is returned to the calling program at block 846. If this component is not an independent source component, then processing continues. At blocks 848 and 850, for each input net to this component, a test is performed to determine whether the scaling factor at this input net equals the scaling factor at the other input nets for this component. This is done by initializing a local variable for the scaling factor as undefined and then setting this variable to the scaling factor value at the first input net that is visited. Then as each input net is visited, its scaling factor is compared to the stored local scaling factor. If any of the scalingwhether the compontrol returns to the calling program at block 852 with an error indicator.

If the scaling factors at all of the inputs are equal, processing proceeds. The flow chart continues at FIG. 8B. At block 854, a test is made to determine the delay is undefined, then a test is made at block 856 to determine whether the input time for this component has been determined. If the input time is not known, control returns to the caller at block 858. If the input time has been defined then the delay is calculated from the input and output times at block 860.

The delay is calculated as follows: First the input time is subtracted from the output time. The result is divided by the scaling factor for the input net for this component. Then this value is added to the value of the offset for this component. The offset is set by the user and stored in the component-instance data structure and is non-zero when the user desires that two images arrive at a component in indirect correspondence. At block 862, the calculated delay is tested to see if it is negative. If it is negative, an error indicator is set at block 864. Control returns to the calling program at block 866.

If the test at block 854 indicated that the delay is known then, at block 868, the input time is calculated. This is done by multiplying the delay by the scaling factor and subtracting the result from the output time. At block 870, the component-instance data structure is checked to determine whether the input time has been previously defined. If it has, then, at block 872, the stored value is compared to the calculated value of input time. If the values are unequal, an error indicator is set at block 874. Control returns to the calling program at block 880.

If the input time has not been previously defined, then at blocks 882 and 884, for each input net, a test is made to determine whether this net is the from-net, and, if it is, it is ignored. Otherwise, at block 886, the time-scan-net function is called for this net, with the input time passed as one of the parameters. When all input nets have been scanned, control returns to the calling program at block 888.

Referring to FIG. 8C, the time-scan-net function 890 is illustrated. This function is called with pointers to a net-instance, a from-component, and a variable indicating the component input or output time as determined by the calling function. The from-component indicates the component from which this net was traced. At block 892, a test is made to determine whether the net time variable for this net has been previously defined. If it has, then a test is made at block 894 to determine whether the defined net time equals the input or output time passed from the calling function. If the times do not match then an error indicator is set at block 896. Control returns to the calling program at block 898.

If the net time is undefined, then, at block 900, the net time is set to the value of the time passed from the calling function. Then, at blocks 902 and 904, for each component driven by this net, a test is made to determine whether this component has already been visited and, if it has, it is ignored. If this component has not been visited, then at block 906, the function time-scan-comp-in is called with the net time passed as one of the parameters. Then, at blocks 908 and 910, for each component driving this net, a test is made to determine whether this component has been visited. If it has, it is ignored. If it has not been visited, then the function time-scan-comp-out is called at block 912 with the net time passed as one of the parameters. Control returns to the caller at block 914.

Referring to FIG. 8D, the function time-scan-comp-in 920 is illustrated. This function is called with pointers to a component-instance, a from-net, and, the net time passed from the calling function.

At block 922, a test is made to determine whether this component is disabled. If it is, control returns to the calling program with an error indicator at block 924. If the component is enabled, then at block 926 the component-instance structure is checked to determine whether the input time for this component has been defined. If it has, then, at block 928, the stored input time is compared to the net time passed to this function indicating the time on the input net. If these values do not match, then, at block 930, control returns to the calling program with an error indicator.

If the input time has not yet been defined, then, at block 932, it is set to the value of the net time passed to this function. Then at blocks 934 and 936, for each input net connected to this component, a test is made to determine whether this net is the from-net. If this net is not the from-net, then at block 938 the function time-scan-net is called for this net, with the input time passed as one of the parameters. Then, at block 940 a test is made to determine whether this is a destination component, and, if it is, control returns to the calling program at block 942. Otherwise, at blocks 944 and 946, for each output net connected to this component, the scaling factors are compared to verify that the scaling factors are equal at each net. If the scaling factors do not match, then control returns to the calling program at block 948 with an error indicator. At block 950, the component-instance data structure is checked to determine whether the delay variable is known. If the delay is currently unknown, then, at block 952, the component-instance structure is checked to see whether the output time for this component is known. If it is not known, then control returns to the calling program at block 954. If the output time is known, then the delay is calculated at block 956. This calculation is performed by subtracting the input time from the output time and dividing the result by the input net scaling factor for this component. If an offset for this component has been specified, then it is added to the delay. Then, at block 962, the delay is tested to see whether it is less than 0. If the delay is less than zero, then at block 964, an error indicator is set. At block 960 control returns to the calling program.

If the test at block 950 determines that the delay is already known for this component, then, at block 968, the output time is calculated. The output time is calculated by multiplying the component delay by the input net scaling factor for this component and adding the result to the input time. At block 970, the component-instance structure is checked to see whether an output time has been previously defined for this component. If it has, then, at block 972, it is compared to the value of the output time which was just calculated. If these values do not match, an error indicator is set at block 974. Control returns to the caller at block 976.

If the test at block 970 indicates that the output time was not previously defined, then, at blocks 978 and 980, for each output net connected to this component, a test is made to determine whether this component is the from-component. If it is not, then at block 982 the function time-scan-net is called for the output net, with the output time passed as one of the parameters. At block 984, when all nets have been scanned, control returns to the calling program.

When the timing analysis is completed, each net has the relative time from the time at which the group starts execution until the first virtual pixel will arrive at that net. The variable delays have been resolved, unless too many variable delay components have been included in the circuit, in which case the circuit is unconstrained and unresolvable. Any timing conflicts have generated a warning message and aborted the simulation.

After the timing analysis is successfully completed for a particular group of components, control returns to the start-group function and the actual simulation of that group is scheduled. The simulator maintains an event queue system to schedule future events. Two kinds of events are queued: simulation events and update events. A simulation event represents the start of processing of a single frame of data on a group of components forming a synchronous pipeline. An update event is scheduled after the completion of the simulation event and represents the end of processing for a single frame of data for the group of components.

When a group of components is scheduled for simulation, all of the precomputations for the group have been made and all of the components in the group have been marked active. The control program may now prepare and schedule some other group for simulation or it may relinquish control by calling a "wait" function. No actual simulation occurs until a wait function is called. When a wait function is called, simulated time is advanced up to the start time of the next scheduled event in the event queue and that event is executed. Events in the event queue are executed in their scheduled order until there are either no more events in the queue or a time specified by the simulation control program has been reached.

The simulator maintains a current simulated time variable. When an event in the event queue is executed, the simulated time variable is advanced to the start time for this event. If the event is a simulation event, the current simulated time variable is set to the time at which processing starts for this group, and the time variable is not advanced during the simulation of the group. However, the processing of an entire frame of data by each component in the group is simulated until the simulation of the behavior of the group is complete. The simulation thus extends into the future, at each component in the group, beyond the time represented by the simulated time variable. The simulator will not, however, simulate events occurring earlier than this time. The simulated time variable is used as a reference time for many analytical computations which are used to compute the details which would have been found by observing a more detailed and time-consuming simulation by a conventional technique, i.e., a technique wherein all events occurring in the system at the simulated time are simulated before any future events are simulated.

The execution of a simulation event for a scheduled group of components will now be described. Referring to FIG. 9, the simulate-group function 1000 is illustrated. This function is called with a pointer to a group list when the next scheduled event is a simulation event. At block 1002, a finish-time variable is initialized to the current simulated time. As each component is simulated this variable is adjusted to indicate the component's finishing time, if that time is later than the previously recorded time. Next, at blocks 1004 and 1006, the simulate-pipeline function is called for each of the source components in the group. This will result in the entire group of components being simulated, one pipeline at a time. The simulate group function will then, at block 1008, schedule an update event for the group at the finish time of the latest finishing component. Control returns to the caller at block 1010.

Details of the simulate-pipeline function 1020 are illustrated in FIG. 9A. This function is called with a pointer to a particular source component. At block 1022, a test is made to see whether the component is enabled. If the component is not enabled, the function returns control to the calling function at block 1024. Otherwise, at block 1026, the originate function is called for the specified source component, with a pointer to the component instance data structure for this component.

The originate function allocates an output buffer for this component and then calls the appropriate image processing library function to simulate the sourcing behavior of this component for an entire frame of data. The image processing library functions utilized in this embodiment are described in detail in Appendix B. A timing computation is performed to compute the time at which this component would finish. If this time is later than the previous latest finishing time then this time is recorded as the new latest finishing time for the group. Control is then returned to the simulate-pipeline function. At block 1028, the successor component order is computed, i.e. the order in which components connected to the output of this component should be simulated. Then, at blocks 1030 and 1032, the simulate-component function is called for each component in the successor component order. Control returns to the caller at block 1034.

FIG. 9B illustrates the simulate-component function 1040. This function is called with a pointer to a component-instance structure. At block 1042 a test is made to determine whether the component is enabled, and if it is not, control is returned to the caller at block 1044. Otherwise, the image function for this component is called at block 1046 with a pointer to the component instance data structure. The image function is similar to the originate function for source components. The image function locates the input image data for each input net to this component, using a pointer in the net-instance structure, and determines whether all of the input image buffers (if any) have been computed. Output buffers are allocated for this component and the appropriate image processing library function is called to simulate the performance of this component on an entire frame of data. The input image buffers may then be freed (if they are no longer required) and the output image buffers are linked to the output net so that they are available for subsequent components. Finally, the finishing time is computed and, if appropriate, the latest finish time is updated. Control then returns from the image function to the simulate-component function, where, at block 1048 a test is made to determine whether this is a destination component. If it is, control is returned to the calling program at block 1050. Otherwise, at block 1052, the successor component order for this component is computed and, at blocks 1054 and 1056, for each component in the successor order, the simulate-component function is called recursively. When all of the successor components connected to the output nets of this component have been followed to the destination components which delineate the extent of the group, control returns to the simulate-pipeline function, and eventually to the simulate-group function of FIG. 9. The process is repeated for each source component until each component in the group has been visited. An update event is then scheduled for this group.

As previously noted, when a particular group of components is simulated, the simulated time variable is not advanced beyond the start time for this group. However, events are simulated which extend into the future beyond that time, and the latest finishing time for the components in the group is computed. The next event to be simulated may be scheduled to start at a simulated time which is between the start time of the prior simulated event, and the computed finish time of that event. Care must be taken to ensure that, except as allowed by the component connections, the results of the simulation of a group are not made available to the rest of the system until simulated time catches up with the time at which the execution of the group of components on an entire frame of data finishes. The invention ensures this by distinguishing update events from simulation events. An update event is scheduled for the latest finish time for the group and is queued for execution at that time. The update event signals to all of the components in the group that they can make available any results to any other functions. It also clears the active flag so that components can again be rescheduled.

The execution of an update event is illustrated by FIGS. 10–10B. The update-group function 1100 calls the update-pipeline function for each source component (blocks 1102 and 1104). The update-pipeline function 1130 calls the reschedule function associated with the source component at block 1132. The reschedule function may set flags or transfer data from temporary buffers to final buffers. At blocks 1134 and 1136 the update component function is called for each successor component. Control returns to the caller at block 1138.

Referring to FIG. 10C, the update-component function 1140 calls the update function associated with the particular component. The update function may transfer data from temporary buffers to final buffers (e.g. in a frame buffer component) and set flags indicating that the updated information may be accessed. The component is then marked inactive at block 1144. If this component is a final destination component (block 1146), then, at block 1148 control is returned to the calling program. Otherwise, at blocks 1150, 1152 and 1154, for each component in the successor order, the update-component function is recursively called. When all of the successor components connected to the output nets of this component have been followed to the destination components which delimit the group, control is returned to the update-pipeline function of FIG. 10A and eventually to the update-group function. The process is repeated for each source component until each component in the group has been visited.

The computation of the finish-time for each component will now be explained. The net times which were calculated by the timing analysis step represent the delay from the group start time to the time at which the first virtual pixel arrives at each net. There are three components to this delay: clock delay, line delay, and pixel delay. Each of these delays has been multiplied by the appropriate scaling factor, giving a vector which is a number of clock cycles of delay, scaled pixel cycles of delay, and scaled line cycles of delay. When a component is simulated, and the size of the output image is known, the number of lines and pixels in the image are used to evaluate the actual delay in terms of clock cycles. In this manner the delay until the first virtual pixel would arrive on each net is computed as each component is simulated. This delay, or relative time, is added to the start time for the group to give the absolute time at which the first virtual pixel arrives at each net. Knowing the size of the image, and the offset from the first virtual pixel to the first real pixel (which is propagated from component to component by the simulation function), the absolute time at which the first real pixel and last real pixel arrive at each net is calculated as follows:

First, a global "line-time" parameter for the group is calculated. This parameter is the time in clock cycles which the first source component takes to generate a line. The length of a line is added to the inter-line gap (the time needed for the source to retrace from the end of the line to the start of another). The result is multiplied by the pixel scaling factor for the source output, giving the number of clock cycles to clock one line along a net. This is the "line-time" for the group.

Secondly, the real start time is calculated for each component. The absolute time at which the first virtual pixel arrives at the input nets and the offset from the first virtual pixel to the first real pixel, in lines and pixels, have been calculated. The following equation gives the time at which the first real pixel arrives at the inputs:

$$\text{First-real-time} = \text{First-virtual-time} + (\text{offset-lines} * \text{line-time}) + (\text{offset-pixels} * \text{pixel-scaling factor})$$

Thirdly, the finish time, or time at which the last real pixel is output by the component, is calculated using the size of the output image in lines and columns:

$$\text{Last-real-time} = \text{First-real-time} + (\text{image-size-lines} * \text{line-time}) + (\text{image-size-columns} * \text{pixel-scaling factor})$$

As each component is simulated the latest finishing time is recorded. When the whole group has been simulated it is kgnown what the group finish time is and the update event is scheduled for this time.

The timing analysis techniques described herein are novel techniques which allow the simulator to check that each pipeline is correctly balanced and to assist the user to program variable delay components with the correct value for the default behavior or for an explicitly specified non-standard behavior. The timing data allows the simulator to partition the exchange of data between components and the user's application code in a manner consistent with the reality being simulated, and also allows the simulator to determine the actual performance of the simulated system, including the time it will take for the system to execute.

It has been shown that the simulation technique described herein utilizes internal memory buffers to hold data representative of entire frames of pixels. Images often occupy a relatively large amount of memory, so it is important that the simulator utilize techniques which minimize the number of buffers in use at a particular time. Although there is logically one image buffer associated with each interconnecting net in the simulated system, only those nets which have an image associated with them at any particular time have a real image buffer actually allocated. Furthermore, in some cases, the same region of physical memory in the computer can be shared and used as two image buffers at once.

Consider, for example, an image buffer serving as in input to some processing function, where this image buffer is not required for any subsequent processing function. Only the portion of this buffer containing pixel data which is still being accessed need be actually kept. If the same image processing function is generating an output image, then only that portion of the output buffer which has already had pixel data written into it need be allocated. In some cases the portions of the input and output buffer which must be valid do not overlap. In this case, the same buffer can be used for both the input and the output buffer. A flag in the component data structure indicates whether the function that simulates that component has the required property enabling buffer sharing. The image buffers associated with the interconnecting nets have a reference count variable. When the image buffer is first allocated, this variable is set to the number of functions which will need this image as an input. At each subsequent use of the image buffer, this reference count is decremented by one. Finally, the reference count is decremented to 0 which is the signal that the buffer is no longer is needed. The buffer is deallocated, allowing the freed memory to be reallocated for some other task.

Before each component is simulated, its shared buffer status flag is inspected to determine whether this component could share its input and output buffers as described above. If so, then the reference count for the input buffers are inspected and, if one is found which has a reference count of one, signifying that the buffer will not be required again, then that image buffer is made available as the component's output buffer. In this way the simulator avoids having to allocate unnecessary memory.

Another technique which affects the amount of memory used by the simulator is the choice of simulation order, i.e., the successor component order referred to earlier in connection with FIG. 9A. When an interconnecting net is driven by one component and fans out to several, a choice must be made as to which of the possible successor components to simulate next. All of the choices at each pipeline are divided into three categories. In the first category are placed successor components which have no outputs and which do not store an image after they have been processed. In the second category are placed successor components which have no outputs, but which will retain an image as part of their state after execution of the pipeline. Execution of components in the second category is potentially more expensive than those in the first category. In the final category are placed all of the remaining components. These are the components which have outputs and which potentially involve many more buffers before processing is completed down their particular path. Having categorized each of the successor components, they are executed category by category, with the components within one category being executed in an arbitrary order. This system allows the user to specify that a particular component is to be placed in a particular category, to be executed before or after any other component. Various other categories may be identified and included in the alghorithm. Using this system the simulator thus selects an execution order which minimizes the number of buffers used to store intermediate images.

The preferred embodiment of the invention has now been described for purposes of illustration. It is not intended to be exhaustive or to limit the invention to the precise form disclosed. For example the method of traversing the circuit may be varied from the particular method described. Similarly, the software simulation of the image processing behavior of some of the circuit components could be replaced by using the hardware components themselves as part of the simulator. It is intended that the scope of the invention be defined by the claims appended hereto.

Appendix A

AN INTRODUCTION TO THE VSP SIMULATOR

*Neil Hunt**

Schlumberger Palo Alto Research,

3340, Hillview Avenue,

Palo Alto,

CA 94304.

The VSP simulator is a custom simulator written in 'C' which allows functional simulation of circuits based on the VSP series of chips for Visual Signal Processing. The user develops a circuit by connecting together icons representing VSP modules, and can simulate the performance of his design at each stage.

This paper describes the concept and some of the details of the simulator, including the time-warping technique which allows the simulation to be executed efficiently by a sequential processor, and the way in which the simulation is controlled and application programs are developed for the hardware which is being simulated.

The paper also discusses potential development of the simulator to include real hardware accelerators built from VSP components, and mentions some of the other tools which are being developed for application development with VSP.

---

\* Neil Hunt is also a student at the University of Aberdeen, UK.

INTRODUCTION

This paper describes the VSP simulator being developed at Schlumberger Palo Alto Research. The simulator is a tool for developing vision systems based on the "Visual Signal Processing" family of VLSI components for very high speed image processing and computer vision applications.

VSP Components and Systems

The VSP components are a family of VLSI components intended for processing digital image data at video or near video rates. The components are interconnected by the VSP pixel bus, which transfers pixels in digital form between processing components in raster scan order. All the bits of each pixel are transmitted in parallel on the VSP bus, with a set of handshaking and clock lines to indicate when valid pixels are being transferred, and delimit the extents of each line and frame of video data. Processing rates up to 10 MHz are supported by the prototype components; this rate will be increased to 20MHz or higher in later versions.

The components process pixels in pipelined form. One individual pixel will flow through a sequence or pipeline of processing elements in turn, being transformed at each stage. It takes several clock cycles for a single pixel to undergo all the processing in the pipeline, but at each clock cycle another pixel starts out through the pipeline. Thus after a short delay while the pipeline is filled with pixels, one pixel is processed at each clock cycle. The parallelism of this approach depends upon the length of the pipeline; the longer the pipeline, the more processing stations are operational on each clock cycle.

In addition to the macro pipeline of processing components, the architecture of each individual component is also pipelined. Thus it takes several cycles between a pixel entering a single component before the corresponding pixel emerges.

Almost all of the VSP components have a microprocessor interface. This could be connected directly to a microprocessor bus in simple systems, but often it will be interfaced to a bus called the VSP processor bus; This bus is based on the VME bus physical standard, and allows one or more processors such as the 68000, 32000 series or the clipper to communicate with each of the components in a conventional way. This bus does not support very high volume parallel transfer of data from VSP component to VSP component in the way that the pixel bus connections do, but it does support fast transfer of data to or from one component (at one time) from or to a processor. The main use of this bus is to allow the processor to configure and control each of the components, and to extract data from certain components. The following tasks categories are identified:

1  Determining how many components are connected to the VSP bus, and finding their addresses and configurations.

2   Determining how the VSP pixel bus interconnects the components. This is possible if each pixel bus connection has a sense wire which is accessible to the processor.

3   Initialising each component on the VSP bus to a known reset state.

4   Configuring each component as required for the particular application (loading constants, setting modes etc.).

5   Enabling a group of components to start processing: this includes instructing the source component (eg the camera, or a frame buffer) to start sending a frame of data.

6   Accepting and responding to interrupts from VSP components.

7   Intermission processing: extraction of data and results from components between successive frames of processing, and possibly reloading constants or reconfiguring components before the next frame.

8   Performing any semantic processing on the results of the processing. This could be passed onto another processor, or could be handled by the same processor. The final results will usually involve interfacing with some other devices such as manipulators.

The VSP Family

The VSP family is open ended, so any list of components will be incomplete; in addition at the time of writing, many of the proposed components have not been built, so their details are subject to change. However, the following list gives an idea of some of the components which are available for system design with VSP.

Frame Buffer Controller
> A particularly important component is the Frame Buffer Controller, or FBC. This component has one VSP input, one VSP output, a microprocessor interface, and an interface to dynamic memory. It is intended for buffering the video data, and functions in a large number of modes. It is capable of storing one or many images, of transposing and reflecting images, and may window into an image, or provide a preset margin around an image to enlarge it. Most important, the video data stream arriving at its input does not have to be synchronised with the stream output, thus allowing parts of a VSP circuit to function independently.

Analog to Digital Converter
> This component accepts analog data from a camera or other image source, and converts it into digital form. It adds the handshaking protocols required to interface with the rest of the VSP system via the VSP pixel bus.

Digital to Analog Converter

This component converts stream of digital pixels on the pixel bus into an analog form suitable for driving a CRT or other display device.

Halftone Generator

The HTG component converts 8 bit grey level images to a halftoned binary image suitable for display on bitmap screens, or various graphics printers. Three or four of these in parallel can be used for colour applications.

ALU Component

The VSP family includes a 16 bit two stage ALU, with a multiplier. The two stages allow results to be clipped to maximum or minimum values, allow operations such as min and max to be performed and also allows the ALU component to perform as a averager, averaging four neighbouring pixels together to produce a resulting image of ¼ the resolution of the incoming image.

Lookup tables

Various sizes of lookup tables are available. These can perform monadic arithmetic operations, non linear pixel transformations such as gamma correction or logarithmic compression, or even binary operations where the two incoming pixels each make up part of the total address for the lookup.

Median Filter

The median filter component performs 8 bit median filtering on a 3 × 3 neighbourhood of pixels for noise filtering in images.

Convolver

The convolver component contains 11 multipliers and a summing tree. It may be configured to performs convolution operations on a 3 × 3 neighbourhood of pixels, or in a variety of other configurations. Convolvers may be stacked for larger kernels.

Cellular Logic

One particular configuration of VSP components allows cellular logic processing to be performed on a 3 × 3 neighbourhood of binary pixels. A lookup table generates a result indexed by a nine bit word contructed from the values of the nine input pixels of the neighbourhood.

Region Labeller

The Region labeller component performs a connectivity analysis of a binary image, assigning a unique label to each region of 4- or 8-connected pixels. This is especially useful with the statistics gatherer component below.

Multistatistics Gatherer

A statistics gatherer component computes histograms of images, areas, and moments of regions in an image. These results allow the positions and orientations of many objects to be determined in a single frame time.

Bitplane Area Correlator

The correlator is a highly flexible and powerful component capable of correlating large masks over images at high speed. It is highly programmable, and operates according to a microprogram which allows it to perform many different kinds of operation.

The Simulator Environment

A minimum hardware configuration for the simulator requires a workstation with a bitmap display allowing a schematic to be edited and a frame buffer card with analog to digital and digital to analog converters allowing a video camera and grey scale monitor to be interfaced to the processor.

Current implementations of the simulator are written for the Sun‡ workstation running UNIX† One development version uses a frame buffer card (VG-121) from Datacube∗ to capture images from a camera, and for grey scale output.

The simulator is written in "C", although in places, great advantage is achieved by the use of small sections written in 68000 assembler code. In each case, there is a section written in "C" which performs the same function, and the selection is made at compile time by the use of the "C" preprocessor conditional compilation mechanism.

The Simulator

The user interacts with the simulator in a graphical manner. Using a mouse or other pointing device, he places icons representing component abstractions on a schematic, and draws in interconnects representing pixel bus connections. The connection between the components and the processor is implicit, and is not drawn on this schematic.

Once a high level schematic has been entered, its performance can be simulated. Typically a camera icon will have been included in the circuit. this corresponds to a real camera connected to the frame buffer in the workstation. This allows real images to be input to the simulation. One alternative is to use a different icon which will read images stored in digital form from a file. Such images might have come originally from the same camera, they might be output from a previous run of the simulator, or they might have been captured on some remote system and transferred.

---

‡ Sun Microsystems Inc., 2550 Garcia Avenue, Mountain View, California 94943.

† UNIX is a Trademark of Bell Laboratories.

∗ Datacube Inc., 4, Dearborn Road, Peabody MA 01960.

Results from the simulation, if in the form of images, can be displayed on the grey scale monitor by using the monitor icon, and/or written to a file for more permanent record, using the file writing icon.

Levels of the User Interface

As discussed above, each of the components in a VSP circuit is connected to a control processor which has the tasks of configuring the components, controlling the processing, and interpreting the results.

The simulator supports applications at a variety of levels of detail. The user who is familiarising himself with the capabilities of the VSP components by experimenting with the simulator will allow the simulator to assume a default virtual control program, specifying how the components are to be configured, and giving a simple scheduling sequence.

As the user develops more detailed applications, he can alter the default virtual program to specify alternative configurations and sequencing, but still without actually writing any code.

The user who has desinged a complete system will want to develop the real software to run on that system. The simulator allows part or all of the virtual program to be replaced by a real program. The user codes in a high level language such as C, and compiles and links the program into the simulator, where it runs alongside the simulator code, and interacts with the simulations of the components just as if they were the real components.

Components of the Simulator

1    Graphical Interface Level

2    System Description Level

3    Design Rule Checking

4    Virtual /User Program execution

5    Group construction

6    Clock Rate Scaling Computation

7    Timing Computation

8    Component Simulation

9    Simulation Time Timing Analysis

Other Development Tools

1    The PCB Layout Tool

2    The BAC Programmer System

3    The Other Image Processing Tools

CLASSIFICATION OF THE SIMULATOR

Current simulators generally fall into one of three main classes.

(1) Custom Coded Simulations

The most complex and efficient simulations are generally custom programs written in some conventional programming language, such as 'C', Pascal, or some language with specific extensions to support simulation such as Simula, GPSS etc. Such simulations are generally fast and efficient, expensive to generate, and inflexible - they cannot easily be modified for some other system.

(2) Special Purpose Simulation Languages

For designers working in the digital design field, an increasing number of special purpose simulation systems are becoming available, such as Adlib/Sable, Helix, Helios, Behave, etc. With such a system the user describes a system by a schematic or a set of schematics showing how objects interconnect, and a description of the behaviour of each object in some special purpose language. A preprocessor translates the behavioural descriptions of each object into a target general purpose language such as Pascal, Lisp or C, adding code to handle the interconnections between the objects, and linking a library of functions supporting standard operations. Several features destinguish such systems from custom coded simulators as in (1) above. First, these systems are intended for designers to use, rather than programmers; the languages tend to be simple, and simulations based on stylised examples. Second, these languages tend to be specialised towards digital electronic systems; they include standard nomenclature for interconnection of logic signals between components, registers, clocks and so on.

(3) Fixed Model Simulation Systems

The other end of the spectrum from custom coded simulations are found in simulation systems where a set of very specific models have been prepared by the designer of the simulation system. The user specifies how he has put together the objects which have been modelled, often in a graphical form, and the simulator computes the performance of the system.. Examples are Spice and its variants, where the fixed models are the various transistors and components, and many of the gate and logic level simulators used by gate array designers and TTL board level designers, where the fixed models are the gates and standard cell components. The user of such a system needs no familiarity with a programming language, but has little possibility of specifying anything out of the ordinary. For example, it is not generally possible for a user of a logic design system to add a model of a new microprocessor to an existing simulator.

The VSP simulator is most accurately classified as a fixed model simulator, as it incorporates fixed models of the VSP components. The user is able to control the behaviour of the simulator by writing programs which interface directly to the simulation of the hardware as if interfacing to the hardware itself. This kind of flexibility is more characteristic of class 2 simulation systems. It is also a relatively simple procedure to incorporate new "fixed models" of proposed components into the simulator, by writing new code in 'C'; this is normally a feature of class 1 simulations.

Another classification of simulation systems is between event orientated simulations and object orientated simulations. In event driven simulations the program describes events which occur during the simulation. As events occur, they create situations in which other events are triggered, and so on. An object orientated simulation uses a description of how objects behave under particular circumstances. In an event driven simulation, simulated time advances between events, while in object orientated systems, the operations described by the simulator code last for a length of time. In this case the simulation system must support some notion of concurrency to allow multiple operations to occur simultaneously. Fixed model simulations and simulations written in special purpose simulation languages tend to be written in an object orientated style. Custom code often expresses event orientated simulations. The VSP simulator is object orientated.

The VSP simulator, in common with most other digital simulation systems, can be classified as a discrete time simulator. All actions occur at a time which is a multiple of the clock period. In other cases, for example in Spice type simulators, time is considered to be a continuous variable, which must be approximated in sufficiently small discrete steps for the required accuracy.

APPENDIX B

THE IMAGE PROCESSING FUNCTION LIBRARY

*Neil Hunt*

Schlumberger Palo Alto Research
3340 Hillview Avenue
Palo Alto
CA 94304
(415) 496 4708

INTRODUCTION

This document describes a vision and image processing tools library written in C for the Sun environment. Some 68000 support exists replacing C code to make functions run up to an order of magnitude faster in some cases; in each case, the original C can be used by redefining a preprocessor constant.

Since the functions are all written in C, and the 68000 code is optional, it should be easy to port the library to other machines, especially UNIX machines. A version already exists for VAXen running C, but it is largely untested.

The functions are based on two standards, an in-core image structure, and an image file standard called *picpac*. The most severe limitation of this library is the fact that currently all images must reside in main memory in order to be processed. A 68000 type machine has only a 24 bit (virtual) address space, which limits virtual memory to $2^{24}$ bytes, or 16 Mbytes. Even if all this memory were available for image storage, it would only hold a single 4k × 4k 8 bit image, or four 2k × 2k images. In practice, a section of the machine's address space is taken up by the operating system, and other programs running, so even less than this is generally available.

For reasonable image sizes, this is not a severe limitation. For example, 8 Mbytes allows 32 512 × 512 8 bit images to be held in virtual memory at one time, or 128 256 × 256 images.

It is also possible that the image processing library could be extended to allow processing in a banded fashion, where only a portion or band of each image would be in core at one time. This would certainly complicate programs using the functions, but would allow arbitrary sized images to be processed, by reading in only a portion of the image from disc at any one time.

The image structure includes a specification of the number of bits of precision in each image. This is rounded into a whole number of bytes for memory allocation purposes, (although the picpac file format packs pixels together as closely as possible, only padding to a multiple of 4 bytes at the end of each raster line). Any particular image processing function may support only one precision of image, or may be able to operate with various precisions. Ultimately it is planned to have a version of every processing function for every image precision. It is possible that 8 bit and 16 bit functions will be much more highly optimised than other sizes.

Currently almost no processing functions exist for processing other than eight bit images.

Some of the image processing functions are rather specialised, and were written for use with the VSP simulator. They model processing part of the behaviour of particular VLSI image processing components, and so the form of some of the parameters, or the type of processing performed may be rather unexpected; a particular example of this is the correlation function. In general, these functions have been highly optimised for efficient use in the simulator.

DATA STRUCTURES

The Image Data Structure

A single file image.h contains definitions of the image structure and various other data structures required for image processing with this library. It must be #included at the start of each file which will use image processing functions.

Below is the form of the declaration of the image data structure.

```
/*
 * The in-core image structure format
 *        number of columns in the image
 *        number of rows in the image
 *        bits per pixel 1..32
 *        pointer to parent
 *        pointer to the release pointer
 *        pointer to the picture
 *        title of picture
 * WARNING - Assembler routines depend upon this.
 */ struct image
{
        int             columns;
        int             rows;
        int             base_columns;
        int             num_bits;
```

```
        struct image     *parent;
        struct image     **release_ptr;
        unsigned char    *pic;
        char             title[TITLESIZE];
};
```

The fields columns and rows specify the number of pixels in the image.

The base_columns field specifies the length of each row of pixels in the image buffer. If the image buffer was originally allocated for an image with longer rows, this will be reflected in this parameter.

The value of base_columns multiplied by the pixel size in bytes is the address offset between vertically adjacent pixels in the actual pixel buffer.

The num_bits field specifies the number of bits of precision in each pixel. This is rounded up to the nearest byte for memory allocation.

The pic pointer points to a buffer in memory of arbitrary size where the actual pixels are stored. If this has the value of NIL, then no buffer exists.

It is possible to take a subimage of a parent image; a new image header is allocated, and its pic pointer is pointed to the *same* image buffer as the parent image. The parent pointer field in the subimage is set to reference the image structure of the original image. When a subimage is freed, the image buffer is not released, as it is still referenced by the subimage.

The release_ptr field is used by the memory allocation routines as described in a later section.

The desc field is a string field which may be used for arbitrary character descriptions of the origin and history of an image.

The Picpac file format.

The picpac file format is a standard for image file storage and interchange which is in use at several universities and industrial sites. A single 512 byte header block includes all the descriptive information, including a character string, and the pixels follow in the rest of the file. The header data structure is shown below.

```
#define MAGIC         0177345       /* pp file magic number */
#define DESCSIZE      512 - 5*2     /* max chars in desc */
```

```
/*
 * The picpak header structure
 *      magic number
 *      number of columns
 *      number of rows
 *      number of overlays
 *      bits per pixel
 */ struct pp_head
{
        short           magic;
        short           ncols;
        short           nrows;
        short           novers;
        short           bytsiz;
        char            descrip[DESCSIZE];
};
```

The magic field holds a magic number allowing the system to identify image files, and detect errors when non image files are used in the wrong context.

The fields ncols and nrows specify the dimensions of the image. There are novers overlays, typically one, each of the same size and precision. The image precision is bytsiz bits.

Pixels are packed together with the zeroth pixel in the zeroth overlay occupying the least significant bytsiz bits of the zeroth byte in the file. This is followed by the rest of the overlays of the zeroth pixel at increasingly more significant bit positions in the zeroth byte in the file, extending into subsequent bytes in the file. Each pixel is packed in the same way, and pixels are packed together with no padding bits, until the end of the line, where padding is added to a 4 byte word boundary.

The diagram below gives an example of bit packing.

Image - overlay 0

| 1 | 3 | 5 |
|---|---|---|
| 7 | 5 | 3 |

Image - overlay 1

| 2 | 4 | 6 |
|---|---|---|
| 6 | 4 | 2 |

Picpac file (block 1)

| | | | | | | | |
|---|---|---|---|---|---|---|---|
| 1 | 1 | 0 | 1 | 0 | 0 | 0 | 1 | byte 0
| 0 | 1 | 0 | 1 | 1 | 0 | 0 | 0 | byte 1
| 0 | 0 | 0 | 0 | 0 | 0 | 1 | 1 | byte 2
| 0 | 0 | 0 | 0 | 0 | 0 | 0 | 0 | byte 3
| 0 | 1 | 1 | 1 | 0 | 1 | 1 | 1 | byte 4
| 0 | 0 | 1 | 1 | 1 | 0 | 0 | 1 | byte 5
| 0 | 0 | 0 | 0 | 0 | 0 | 0 | 1 | byte 6
| 0 | 0 | 0 | 0 | 0 | 0 | 0 | 0 | byte 7

(byte labels shown to right of each row)

Note that this image processing library uses only files of 1 overlay.

The picpac format was originally implemented on VAXen, where words are assembled in descending address order from bytes. On other machines, such as the 68000, words are assembled in ascending order from bytes. Since the pixels are stored in a pixel stream format, this part of the file is not affected by the possible alternative interpretation when files are read on two different machines. However, the first 10 bytes of the file are interpreted as 16 bit integers, which are subject to differing interpretations.

The function which reads in an image file first inspects the magic number. If this has been read and interpreted correctly, then it proceeds in the normal way. If it does not recognise this as a correct magic number, it compares it with the constant MAGICSWAPPED, which is the same magic number with the bytes swapped. If this matches, then it swaps the first 5 pairs of bytes before proceeding as before.

The function which writes an image file may be compiled with the symbolic constant SUN defined, in which case the first 5 pairs of bytes will be swapped prior to writing them to the file. If SUN is left undefined, then this will not occur.

The convention which has been adopted, which unfortunately is not standard, is to have all image files in VAX format. If the library is compiled for the SUN, then the byte swapping section is included. Files of either standard may be read by the read function, whichever way the code has been compiled.

ERROR HANDLING

Most of the image processing functions have the type (struct image *), and return a valid pointer to an image for a successful return. Certain functions which are not returning image data (such as im_free, for example) return a pointer to an input image, which has no significance other than being non NILIMAGE.

When an error is detected by the image processing functions, the value NILIMAGE is returned, and the global variable ERROR is set to a parameter which is defined in image.h.

The function SIError returns a descriptive string corresponding to the error number currently found in the ERROR variable. This can be used to print a message about the error, unless some more detailed error diagnosis is provided.

The list of error messages and parameter values is flexible, and grows each time new functions are added to the library. The definition of the strings is at the end of the tool.c file.

MEMORY ALLOCATION

Image Header and Buffer Allocation

Memory is required for image header data structures, and also for the image buffers themselves. Since the image headers are relatively small, typically they will be allocated statically for the entire program, whereas the image buffers may need to be allocated and freed dynamically as processing occurs, in order not to run out of virtual memory address space.

Some image processing functions can reuse the image buffer containing the input image as the buffer for the output image; others require the input image to be unchanged during the processing, and so cannot reuse the same buffer. Particularly when large images are being used, it is important that functions which are able reuse their buffers do so, to conserve memory.

The image processing routines call a number of functions to perform the image allocation and deallocation tasks.

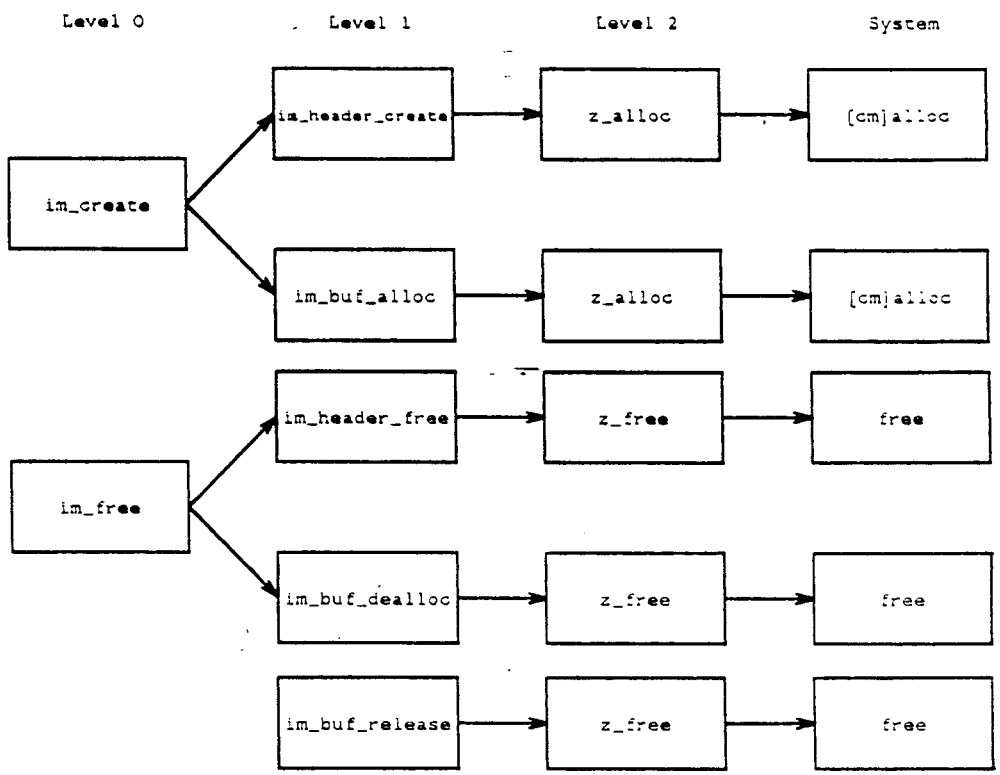

At the simplest level, the memory allocation is left entirely up to the image processing functions. In this case, the image processing function im_func is called with a NILIMAGE pointer to the output image. The image processing function then calls im_create to create the image header and allocate an image buffer. Such an image may be freed again by calling im_free.

If more control over the memory allocation is required, then the functions at level 1 are used. In this case, the image processing function im_func is called with a pointer to a valid image header structure (created by im_header_create) for the output image, but this header may have a NILBUFFER pointer to the image buffer, in which case im_buf_alloc is called by the image processing function to allocate a suitable buffer. An image buffer may be freed by calling im_buf_dealloc (passing the pointer to the image header, rather than the buffer itself, so that the pointer can also be zeroed) The image header may be freed by the function im_header_free.

When operating at this level, the function im_buf_release may also be used by the application program. This function allows a single image buffer to be doubly allocated, to serve as an input and an output to the same image processing function. The function im_buf_release is called with the a pointer to the input image header as a parameter. It saves this pointer on a list called the pf_buffers, and records the fact by setting the release_ptr to point back to the element of the pf_buffers array.

If the image buffer allocation function im_buf_alloc is now called, it will search the list of released buffers for a buffer of sufficient size. If it finds one, it will remove it from the list, and use that buffer; if a suitable buffer is not found, a new buffer is allocated in the usual way.

Finally, when a pointer to the original image is passed as a parameter to the im_buf_release function, the release_ptr will be non zero, signifying that the image was released earlier. If the list element pointed to by the release_ptr points back to the image header itself, then the image buffer is considered to be still on the list, and not reused. In this case, it is deallocated in the usual way. However, if the pointer in the pf_buffers list is NILIMAGE or points to some other image, then the image buffer has been reused, and should not be deallocated.

Thus an application program about to call an image processing function which is able to reuse its input buffer as an output buffer (i.e. one where each output pixel is computed based only on input pixels not yet overwritten, and where the input image is not needed for anything other function) will call im_buf_release before calling the function, thus giving the allocation function notice that it could reuse the input buffer if required.

If an application program wants to have total control over the memory allocation, then it can allocate the image headers and the image buffers before calling the image processing functions. The functions will check to see that the correct size of image has been passed for output, but will perform no other allocation tasks.

General Memory Allocation Functions

The image processing functions (and the functions discussed above) which perform memory allocation tasks all call functions z_alloc and z_free. These have a syntax and semantics very similar to the system routines calloc, malloc and free, and a module in the library contains definitions in terms of these. However, if it is desired to use some alternative possibly more efficient memory allocation system, then alternative versions of these could be included into an applications program. The z_alloc function is called with a parameter indicating whether the memory should be cleared to zero (as with calloc) or not (as with malloc). The function z_size should also be provided, which returns the size in bytes of the block of memory allocated by the z_alloc function. The default z_size function returns the unsigned integer at *((unsigned int)p - 1), which corresponds to the location where the system functions malloc and calloc store a size parameter. This mechanism is undocumented, and is probably not entirely desirable, or portable, but it saves the overhead which would be incurred if z_alloc was required to keep its own size parameter.

See the entries under IMAGE PROCESSING FUNCTIONS.

THE IMAGE PROCESSING FUNCTIONS

Utility Functions.

The following functions are defined in the file tool.c, and are intended for general utility use. Some of these functions are intended for use by other image processing functions.

```
struct image *
im_check1(img)
struct image *img;
```

This function is intended to be called by an image processing function about to do some processing with one input image. (Compare with the next two functions.) It checks that the image header and buffer exist.

```
struct image *
im_check2(img1, img2, columns, rows)
struct image *img1, *img2;
int columns, rows;
```

This function is intended to be called by an image processing function about to do some processing with a single input image and a single output image. It checks that the input image header and buffer exist, and returns a pointer to an output image with a valid buffer of size sufficient for an image of size columns × rows. If the second argument is NILIMAGE, then a whole new image of the correct size is allocated; if the second argument is a pointer to a valid image header with a NILBUFFER pointer, then a buffer of sufficient size is allocated. Finally if the second argument points to a valid image with a valid buffer, the size is checked. If it is the wrong size, then NIL-IMAGE is returned.

```
    struct image *
    im_check3(img1, img2, img3, columns, rows)
    struct image *img1, *img2, *img3;
    struct image *
```

This function is intended to be called by a function about to do some processing with two input images and one output image. It checks that img1 and img2 exist, and allocates or checks img3 just as above.

```
    im_create(ncols, nrows, pixelsize, description)
    unsigned int ncols, nrows, pixelsize;
    register char *description;
```

This function creates an image header, completes the image size description, and allocates an image buffer of sufficient size. It returns a pointer to the image header, or NILIMAGE in case of error. It is defined in terms of functions im_header_create and im_buf_alloc.

```
    struct image *
    im_free(img)
    register struct image *img;
```

This function frees the memory used by an image, and by its associated image buffer, if any. If the image is a subimage (i.e. has a non NILIMAGE parent pointer) then it is assumed that all ancestors are only referenced through this image, and can also be freed recursively. The function returns img, or NILIMAGE in case of error. It is defined in terms of im_header_free and im_buf_dealloc.

```
    struct image *
    im_header_create(description)
    char *description;
```

This function allocates an image header, with zeroed values, and copies the description string into the title slot. It returns a pointer to the new header, or NILIMAGE in case of error. It is defined in terms of z_alloc.

```
    struct image *
    im_header_free(img)
    struct image *img;
```

This function frees the image header. It is an error for the header to contain a non NILBUFFER pointer to an image buffer. The function returns img, or NILIMAGE in case of error. It is defined in terms of z_free.

```
struct image *
im_buf_alloc(img, ncols, nrows, pixelsize)
struct image *img;
unsigned int nrows, ncols, pixelsize;
```

This function allocates an image buffer of sufficient size for an image of the specified dimensions and pixel size. If any buffers have been released (by calling im_buf_release then the first of these (if any) which is large enough is reassigned. The function copies the ima    nensions into the header, and returns the pointer to the header, or NILIMAGE ir.   of error. It is defined in terms of z_alloc.

```
struct image *
im_buf_dealloc(:
struct image *ir
```

This function frees the im.    ʿer, and sets the pointer to NILBUFFER. It is an error for the header not to    a valid buffer. It is defined in terms of z_free.

```
struct image *
im_buf_release(
struct image *i;
```

This function is called by    lication program to record the fact that the buffer currently in use by image    ill be deallocated after the next image processing function call. This buffer    reallocated for use by the same image processing function, if it is large eno    e function returns img, or NILIMAGE in case of error.

```
unsigned char *
z_alloc(size,
unsigned int siz
int unzeroed;
```

This function allocates si    ; of memory, and if unzeroed is zero, the region of memory allocated will be cl-    zero, otherwise it will be left as it was when previously deallocated. A defau.    n of this function is included in the library, which calls the standard library    is malloc or calloc. Users wishing to use a different memory allocation    should supply a different routine.

```
void
z_free(mem)
unsigned char *r
```

This function returns the memory previously allocated by z_alloc to the free pool for reallocation. A default version of this function is defined in terms of the standard library free. It is an error to z_free memory which was not previously z_alloc'd.

```
unsigned int
z_size(mem)
unsigned char *mem;
```

This function returns the size of the block of memory which was previously allocated by z_alloc. The default version of this function relies upon the fact that the standard library versions of malloc and calloc store the size of a block of memory in the four byte word immediately preceding the block of memory. (This size includes the four bytes, which are subtracted before returning a value for z_size.)

```
struct image *
im_header_copy(img1, img2)
register struct image *img1, *img2;
```

This function copies header data from one image to another.

```
struct image *
im_window(img1, img2, new_columns, new_rows, offset_cols,
offset_rows)    struct image *img1, *img2;
unsigned int new_columns, new_rows, offset_cols, offset_rows;
```

This function creates a subimage of the original image. The original image remains valid. Two cautions: (1) When im_free or im_buf_dealloc is called, the parent relationship is terminated, but the image buffer remains associated with the parent image; this means that the parent image must be freed or deallocated in order to finally make the memory available for other images again. (2) If the parent image is freed or its buffer deallocated while the subimage is still in existence, the image buffer *will* be deallocated. This means that references to the subimage after the parent image has been released will cause an addressing error of some sort.

```
struct image *
im_copy_window(img1, img2, cols, rows, src_off_cols,
   src_off_rows, dst_off_cols, dst_off_rows)
struct image *img1, *img2;
unsigned int cols, rows, src_off_cols, src_off_rows,
   dst_off_cols, dst_off_rows;
```

This function copies a window of size from the source image to the destination image, copying from an origin src_off_cols, src_off_rows in the source image to an origin dst_off_cols, dst_off_rows in the destination image. If any portion of the window to be copied lies outside the bounds of the source image or the destination image, then the effective window is truncated. If a destination image buffer is

File IO functions

```
struct image *
im_disc_to_core(filename, img)
char *filename;
struct image *img;
```

This function reads the named picpac file into memory, creating an image structure if necessary. Either VAX or SUN style byte orders are accepted.

```
struct image *
im_core_to_disc(img, filename)
struct image *img;
char *filename;
```

This function writes the image out to a picpac file. Either VAX or SUN style files may be written, depending upon the definitions in force when the code is compiled.

Frame Buffer Functions

```
struct image *
im_grab(img, preview)
struct image *img;
int preview;
```

This function digitises an image from the camera attached to a Datacube frame buffer card. If no buffer is specified, then an image of the full frame buffer size is grabbed, otherwise an image of the size specified in the image header is grabbed, centred within the field of view. If preview is zero, then the frame is digitised immediately, otherwise the frame buffer is set into continuous acquire mode, and the user prompted to focus and adjust before sending carriage return. If the user instead types a valid filename, then an image is read from that file, using im_disc_to_core.

```
struct image *
im_core_to_crt_xy(img, x, y)
struct image *img;
int x, y;
```

This function displays the image on the monitor attached to the Datacube frame buffer, with origin at the specified position.

```
struct image *
im_core_to_crt(img)
struct image *img;
```

This function displays an image centred on the display.

```
void
draw_box_bw(x1, y1, x2, y2, bw)
register int x2, y2, bw;
int x1, y1;
```

This function draws a rectangle with value bw at the position specified on the monitor.

```
void
clear_crt_bw(bw)
```

This function clears the monitor to the value bw.

```
void
clear_rect_bw(x1, y1, x2, y2, bw)
int x1, y1, x2, y2, bw;
```

This function clears a rectangle on the display to the value bw.

Image Processing Functions

```
struct image *
im_alu8(i1, i2, i3, mode)
struct image *i1, *i2, *i3;
int mode;
```

This function performs arithmetic operations on images i1 and i2, placing the result in i3. The operations performed are specified by the mode flag. Current modes include:

```
#define ALU8_ADD_U_2      1
#define ALU8_ADD_S_2      2
#define ALU8_SUB_U_2      3
#define ALU8_SUB_S_2      4
#define ALU8_DIFF_2       5
#define ALU8_SQ_DIFF_2    6
#define ALU8_MUL_U_2      7
#define ALU8_DIV_U_2      8
#define ALU8_AND_2        9
#define ALU8_OR_2         10
#define ALU8_XOR_2        11
#define ALU8_AVG_2        12
#define ALU8_MEAN_SQ_2    13
```

```
struct image *
im_convolve(img1, img2, coef, sscale)
```

```
    struct image *img1, *img2;
    int coef[];
    int sscale;
```
This function

```
    struct image *
    im_convolve_mn(img1, img2, mm, nn, ccoef, sscale)
    struct image *img1, *img2;
    int ccoef[];
    int mm, nn, sscale;
```
This function

```
    struct image *
    im_connect(img1, img2, equiv_buf, p_num_regions, connectedness)
    struct image *img1, *img2;
    uchar *equiv_buf;
    int *p_num_regions;
    int connectedness;
```
This function

```
    struct image *
    im_dither(img, out, scale_x, scale_y, thresh_noise_mask,
        error_nois neg_thresh, pos_thresh)
    struct image *img, *out;
    int scale_x, scale_y;
    int thresh_noise_mask, error_noise_mask;
    int neg_thresh, pos_thresh;
```
This function

```
    struct image *
    im_dither2(img, out, scale_x, scale_y, thresh_noise_mask,
        error_noi neg_thresh, pos_thresh)
    struct image *img, *out;
    int scale_x, scale_y;
    int thresh_noise_mask, error_noise_mask;
    int neg_thresh, pos_thresh;
```
This function

```
    struct image *
    im_lookup(img1, img2, table)
    struct image *img1, *img2;
    unsigned char table[];
```

This function

```
struct image *
im_w_median(img1, img2, weight, span)
struct image *img1, *img2;
int weight[];
register int span;
```

This function

```
struct image *
im_median_mn(img1, img2, m, n)
struct image *img1, *img2;
int m, n;
```

This function

```
struct image *
im_morphology(img1, img2, table)
struct image *img1, *img2;
unsigned char table[];
```

This function

```
struct image *
im_resample(img1, img2, scale_x, scale_y)
struct image *img1, *img2;
int scale_x, scale_y;
```

This function

Pattern Recognition Functions

```
struct image *
im_correlate(program,image_columns,image_rows,mask_columns,mask_
   thresh, p_best_val, p_best_i, p_best_j, p_count, int_func)
struct cor_instr *program;
int image_columns, image_rows, mask_columns;
register int mask_rows;
int *p_best_val;
short *p_best_i, *p_best_j;
int *p_count;
int thresh;
int (*int_func)();
```

This function

```
    struct image *
    im_pack(img1, plane, img2)
    struct image *img1, *img2;
    int plane;
```

This function

```
    struct image *
    im_statistics(img1, img2, index, incr, constant, results)
    struct image *img1, *img2;
    int index, incr;
    unsigned int *results;
```

This function Possible values for the index and incr parameters are:

```
    #define STAT_CONST     1
    #define STAT_IMAGE1    2
    #define STAT_IMAGE2    3
    #define STAT_I         4
    #define STAT_J         5
    #define STAT_II        6
    #define STAT_JJ        7
    #define STAT_IJ        8 define STAT_BAD       9 struct sun_crt_desc *
    im_sun_crt_create(x, y, w, h)
    int x, y, w, h;
```

This function

```
    struct image *
    im_sun_crt(img, ssdp)
    struct image *img;
    struct sun_crt_desc *ssdp;
```

This function

```
    void
    im_sun_crt_destroy(ssdp)
    struct sun_crt_desc *ssdp;
```

This function

We claim:

1. A method for simulating on a computer an electronic digital circuit, said circuit comprising a plurality of components and a plurality of nets for connecting said components, at least one of the components being connected to at least one input net and to at least one output net for generating an output vector on each of said output nets in response to an input vector on each of said input nets according to a known processing behavior, said input vector and said output vector comprising an ordered set of data elements transmitted serially on a net, said method comprising:

(a) defining a group of components which must operate in synchronism;

(b) calculating a scaling factor for each input net connected to any component in the group, the scaling factor indicating a rate at which valid data elements arrive at the input net;

(c) calculating a reference element input time for each input net connected to any component in the group, the reference element input time indicating a time at which a predetermined one of the ordered set of data elements arrives at the input net;

(d) for each component connected to a plurality of input nets:
  (i) comparing the calculated scaling factors for all of the component's input nets; and
  (ii) comparing the calculated reference element input times for all of the component's input nets;
thereby synchronizing the timing of said group by ensuring that all corresponding data elements will arrive together at each component having a plurality of inputs;

(e) generating and storing at least one output vector in response to at least one input vector according to the known processing behavior of a first component in the group;

(f) repeating step (e) for each component in the group connected to at least one input net and at least one output net, to generate at least one group output vector; and (g) determining a component finish time for each component in the group to generate a latest component finish time.

2. The method of claim 1, further comprising the step of:
calculating delay values for those components having a variable delay to ensure that all reference element input times are equal.

3. The method of claim 1 in which said circuit is a circuit for processing video image data and said data elements represent picture elements and said vectors represent frames of picture elements.

4. The method of claim 3 further comprising the steps of:
receiving an input image from a camera;
digitizing said image to produce a frame of picture element; and
displaying on a monitor at least one group output vector as a frame of picture elements.

5. The method of claim 1 wherein the circuit comprises a plurality of synchronous groups of components, the method further comprising the steps of:
repeating all of the steps of claim 1 for each group in the circuit; and
reporting at least one of said group output vectors and a latest one of said finish times.

6. The method of claim 5 further including the step of passing a group output vector from a first group to a second group having a start time later than the latest component finish time generated for said first group.

7. An apparatus for simulating an electronic circuit for processing visual image data, said circuit comprising a plurality of components and a plurality of nets for connecting said components, at least one of the components being connected to at least one input net and to at least one output net for generating an output frame on each of said output nets in response to an input frame on each of said input nets according to a known processing behavior, said input frame and said output frame comprising an ordered set of picture elements transmitted serially on a net, the apparatus comprising:

a camera;
a frame buffer card coupled to said camera;
a computer workstation coupled to said frame buffer card for reading and writing to said frame buffer;
a monitor coupled to said frame buffer;
said workstation being programmed to simulate the circuit in response to an image from said camera, and to cause an output image to be written to said frame buffer and displayed on said monitor, said program comprising:
means for:
(a) defining a group of components which must operate in synchronism;

(b) calculating a scaling factor for each input net connected to any component in the group, the scaling factor indicating a rate at which valid picture elements arrive at the input net;

(c) calculating a reference element input time for each input net connected to any component in the group, the reference element input time indicating a time at which a predetermined one of the ordered set of picture elements arrives at the input net;

(d) for each component connected to a plurality of input nets;
  (i) comparing the calculated scaling factors for all of the component's input nets; and
  (ii) comparing the calculated reference element input times for all of the component's input nets;
thereby synchronizing the timing of said group by ensuring that corresponding picture elements will arrive together at components having a plurality of inputs;

(e) generating and storing at least one output frame in response to at least one input frame according to the known processing behavior of a first component in the group;

(f) repeating step (e) for each component in the group having at least one input net and at least one output net, to generate at least one group output frame;

(g) determining a component finish time for each component in the group to generate a latest component finish time;

(h) repeating steps (a) thru (g) for each group of components which must operate in synchronism, to generate a circuit output frame; and (i) writing the circuit output frame to said frame buffer card for display on said monitor.

8. The apparatus of claim 7, wherein said workstation is further programmed for calculating delay values for those components having variable delays to ensure that all reference element input times are equal at those components having a plurality of inputs.

9. A method for simulating on a computer an electronic digital visual image processing circuit, said circuit comprising a plurality of components and a plurality of nets for connecting said components, at least one of the components being connected to at least one input net and to at least one output net for generating an output frame on each of said output nets in response to an input frame on each of said input nets according to a known processing behavior, said input frame and said output frame comprising an ordered set of picture elements transmitted serially on a net, said method comprising:

(a) defining a first group of components which must operate in synchronism;

(b) calculating a scaling factor for each input net connected to any component in the group, the scaling factor indicating a rate at which valid picture elements arrive at the input net;

(c) calculating a reference element input time for each input net connected to any component in the group, the reference element input time indicating a time at which a predetermined one of the ordered set of picture elements arrives at the input net;

(d) for each component connected to a plurality of input nets:
 (i) comparing the calculated scaling factors for all of the component's input nets; and
 (ii) comparing the calculated reference element input times for all of the component's input nets;
thereby synchronizing the timing of said group by ensuring that all corresponding picture elements will arrive together at each component having a plurality of inputs;

(e) generating and storing at least one output frame in response to at least one input frame according to the known processing behavior of a first component in the group;

(f) repeating step (e) for each component in the group connected to at least one input net and at least one output net, to generate at least one group output vector;

(g) determining a component finish time for each component in the group to generate a latest component finish time;

(h) repeating steps (a) thru (g) for each group of components which must operate in synchronism to generate a circuit output frame and a circuit finish time; and (i) storing the circuit output frame.

10. The method of claim 9 further comprising the steps of:
displaying the stored circuit output frame; and
reporting a circuit finish time.

11. The method of claim 9 further comprising the step of:
calculating delay values for those components having variable delays to ensure that all reference element input times are equal at those components having a plurality of inputs.

12. The method of claim 9 wherein the scaling factors calculated by said calculating step comprise a line rate scaling factor and a picture element rate scaling factor.

13. The method of claim 9 wherein there is a largest frame in a group and the largest frame has a first picture element and the reference element input time is a relative time at which a first virtual picture element arrives at an input net, the first virtual picture element being the first picture element in the largest frame in the group.

* * * * *